United States Patent
Beard et al.

(10) Patent No.: US 6,434,187 B1
(45) Date of Patent: Aug. 13, 2002

(54) DIGITAL RADIOFREQUENCY TRANSCEIVER

(75) Inventors: Paul F. Beard, Milpitas; Mark D. Moore; Drew M. Harrington, both of Palo Alto, all of CA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/179,212

(22) Filed: Oct. 26, 1998

Related U.S. Application Data

(63) Continuation of application No. 09/127,087, filed on Jul. 31, 1998, now abandoned.
(60) Provisional application No. 60/061,940, filed on Oct. 14, 1997.

(51) Int. Cl.[7] .................................................. H04B 1/40
(52) U.S. Cl. ........................ 375/219; 375/239; 375/297; 375/306; 375/326; 332/128; 455/86
(58) Field of Search .............................. 375/219, 295, 375/296, 297, 306, 307, 316, 318, 327, 328, 239, 326; 455/73, 76, 86; 370/213; 332/112, 127, 128; 329/307, 313; 331/1 R, 10, 14, 25

(56) References Cited

U.S. PATENT DOCUMENTS

| | | | |
|---|---|---|---|
| 5,230,088 A | * 7/1993 | Kramer, Jr. et al. | ......... 455/76 |
| 5,471,652 A | 11/1995 | Hulkko | ......... 455/76 |
| 5,598,405 A | * 1/1997 | Hirose | ......... 370/280 |
| 5,704,351 A | * 1/1998 | Mortara et al. | ......... 600/382 |
| 5,718,234 A | 2/1998 | Warden et al. | ......... 128/696 |
| 5,850,597 A | 12/1998 | Tanaka et al. | ......... 455/115 |
| 5,854,621 A | * 12/1998 | Junod et al. | ......... 345/158 |
| 6,097,305 A | * 8/2000 | Im et al. | ......... 340/825.19 |
| 6,211,747 B1 | * 4/2001 | Tricket et al. | ......... 332/128 |

* cited by examiner

*Primary Examiner*—Young T. Tse
(74) *Attorney, Agent, or Firm*—Christopher P. Maiorana, P.C.

(57) ABSTRACT

A method for radiofrequency (RF) transmission of digital information includes generating an RF signal using a voltage-controlled oscillator (VCO), stabilizing the RF signal from the VCO by providing an error signal from a phase-locked loop (PLL) to an input of the VCO, and combining the digital information with the error signal of the PLL input to the VCO, thereby causing variations in frequency of the RF signal from the VCO that represent the digital information. Apparatus for RF transmission of digital information includes a VCO, the VCO arranged to generate an RF signal, a PLL, the frequency input of the PLL coupled to the RF signal output of the VCO, an encoder, the encoder arranged to convert the digital information into a form where it has a data rate faster than a response time of the PLL, and a coupler, the coupler coupling both the error signal output of the PLL and the encoded digital information to an input of the VCO.

41 Claims, 16 Drawing Sheets

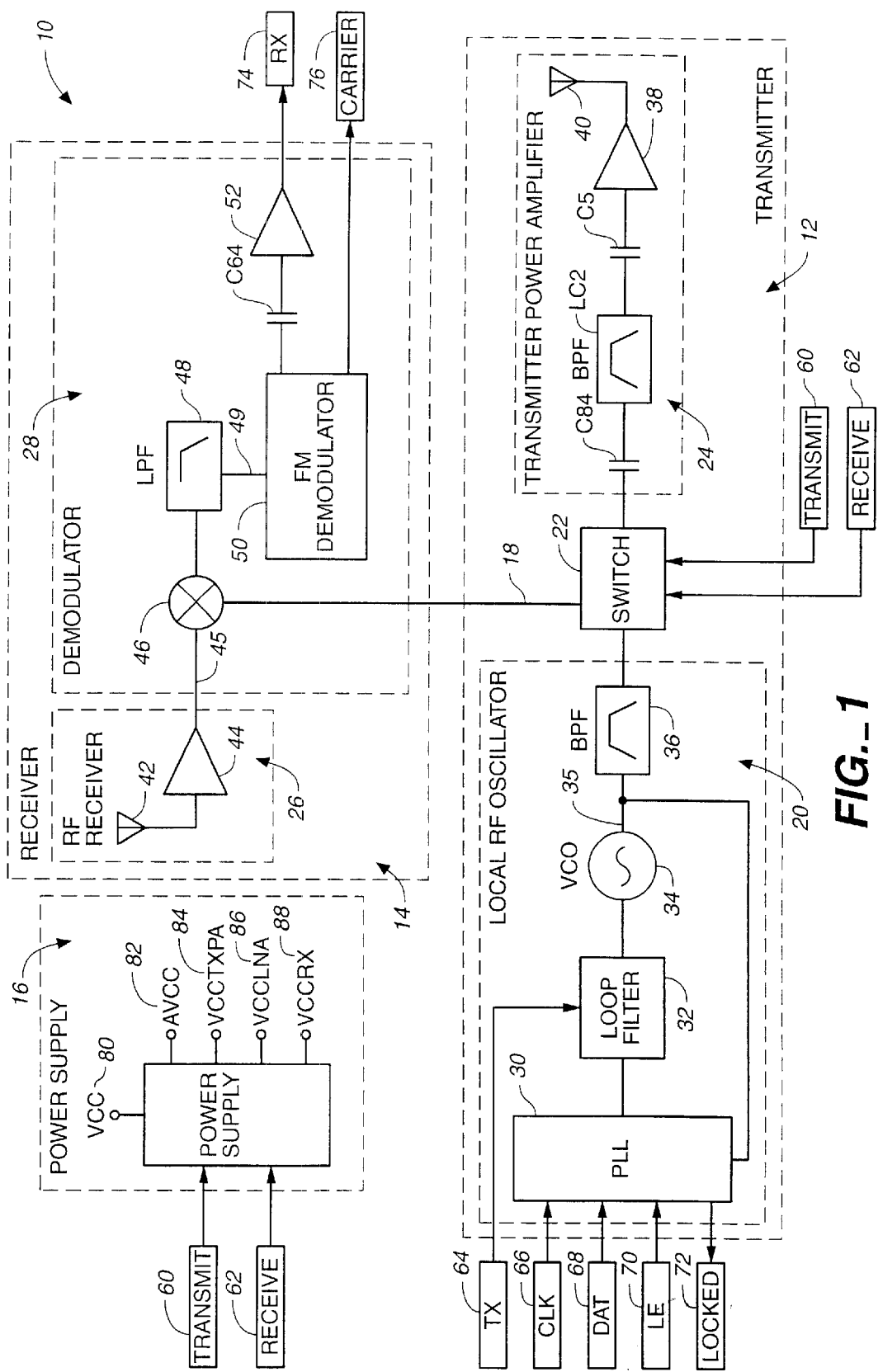
FIG._1

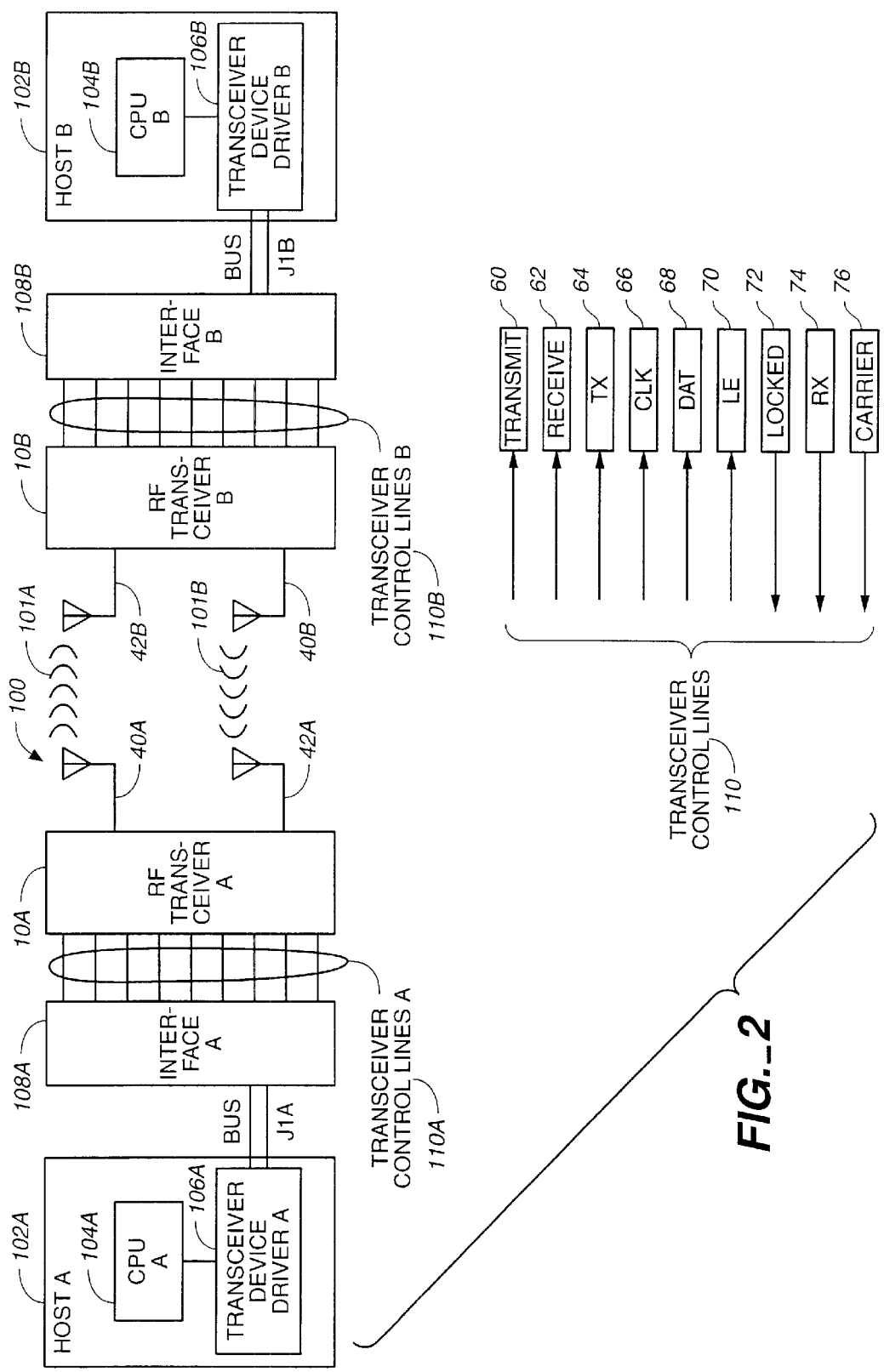
FIG._2

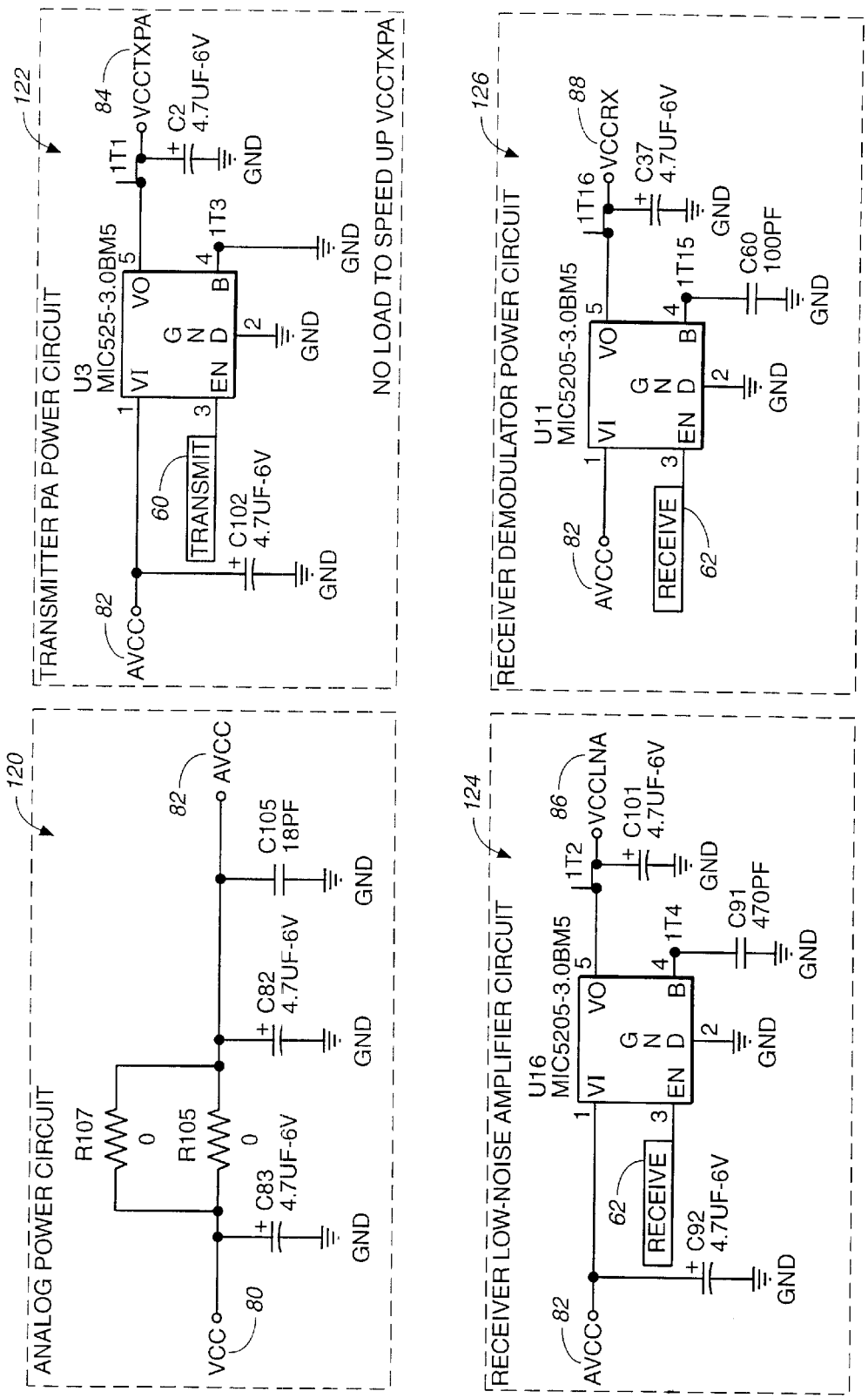
FIG._3

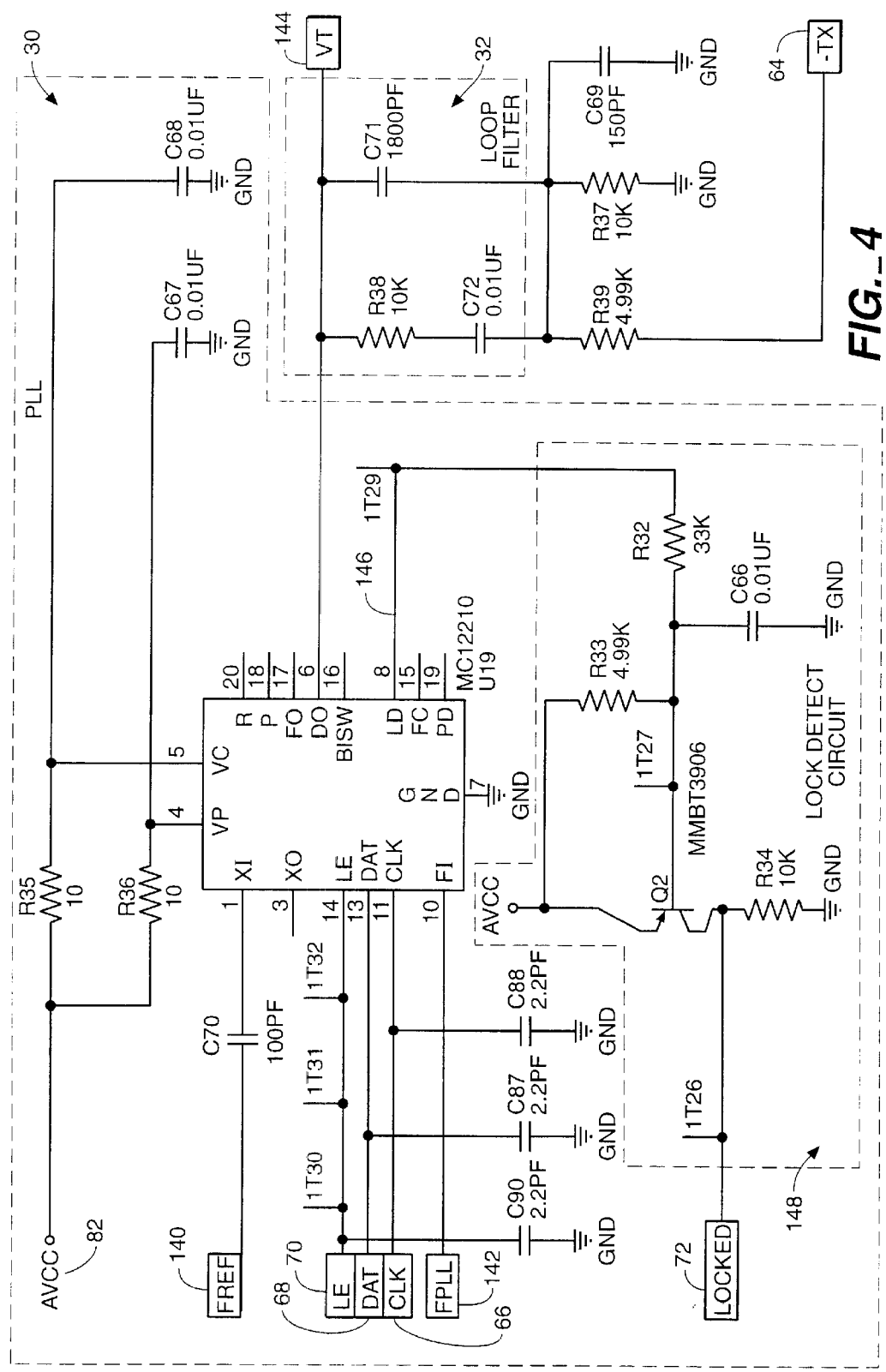
FIG._4

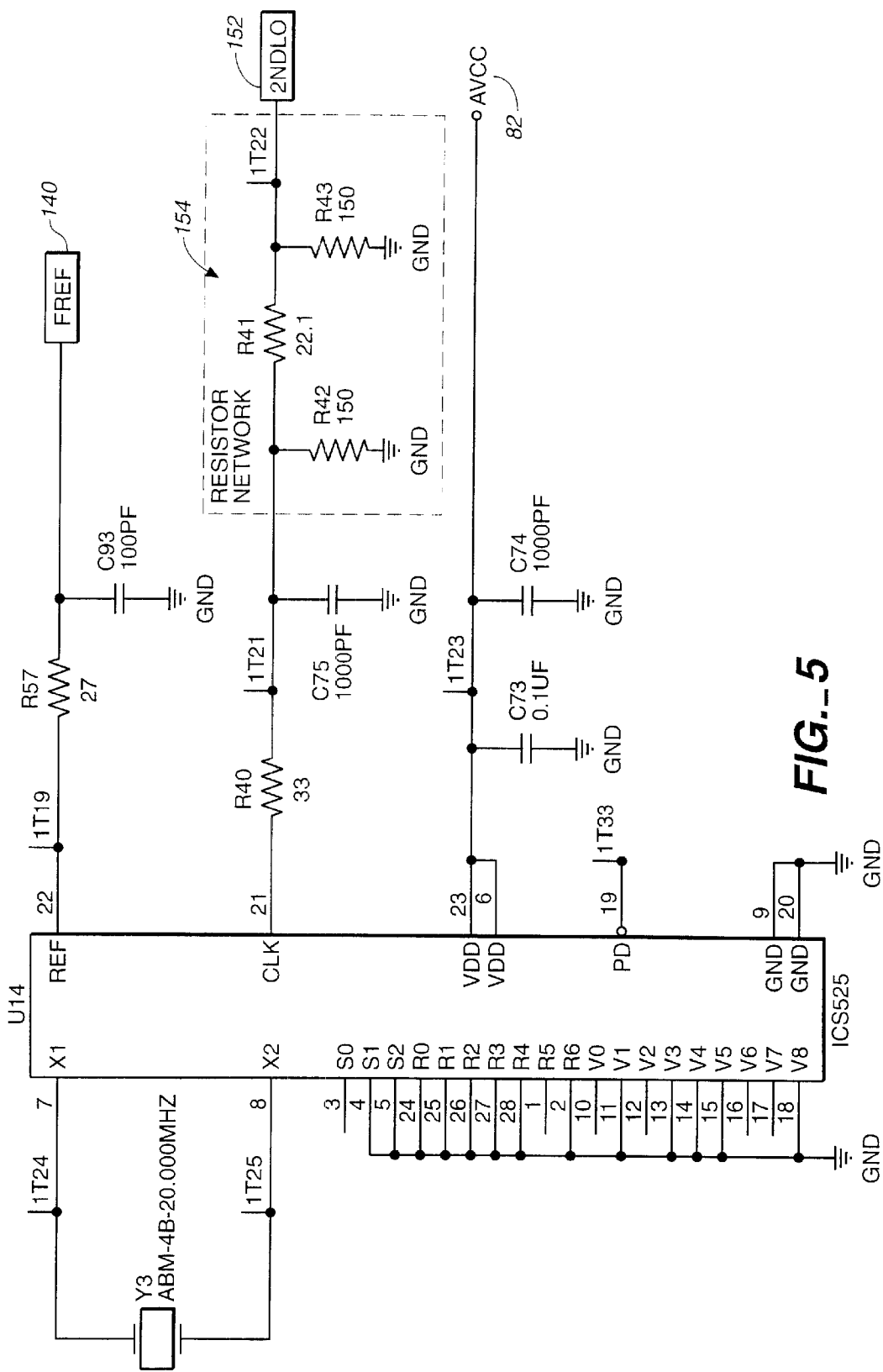
FIG._5

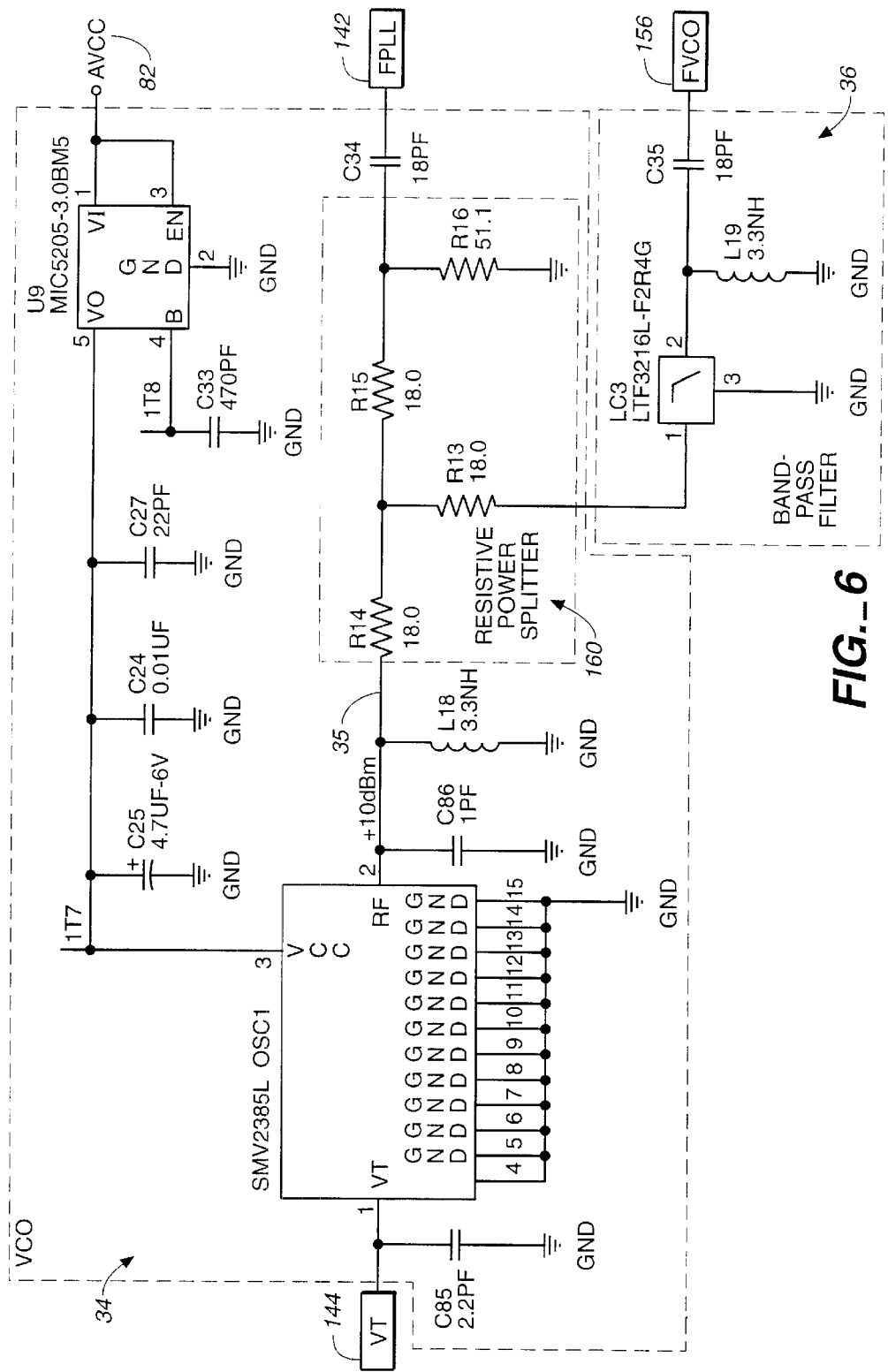
FIG._6

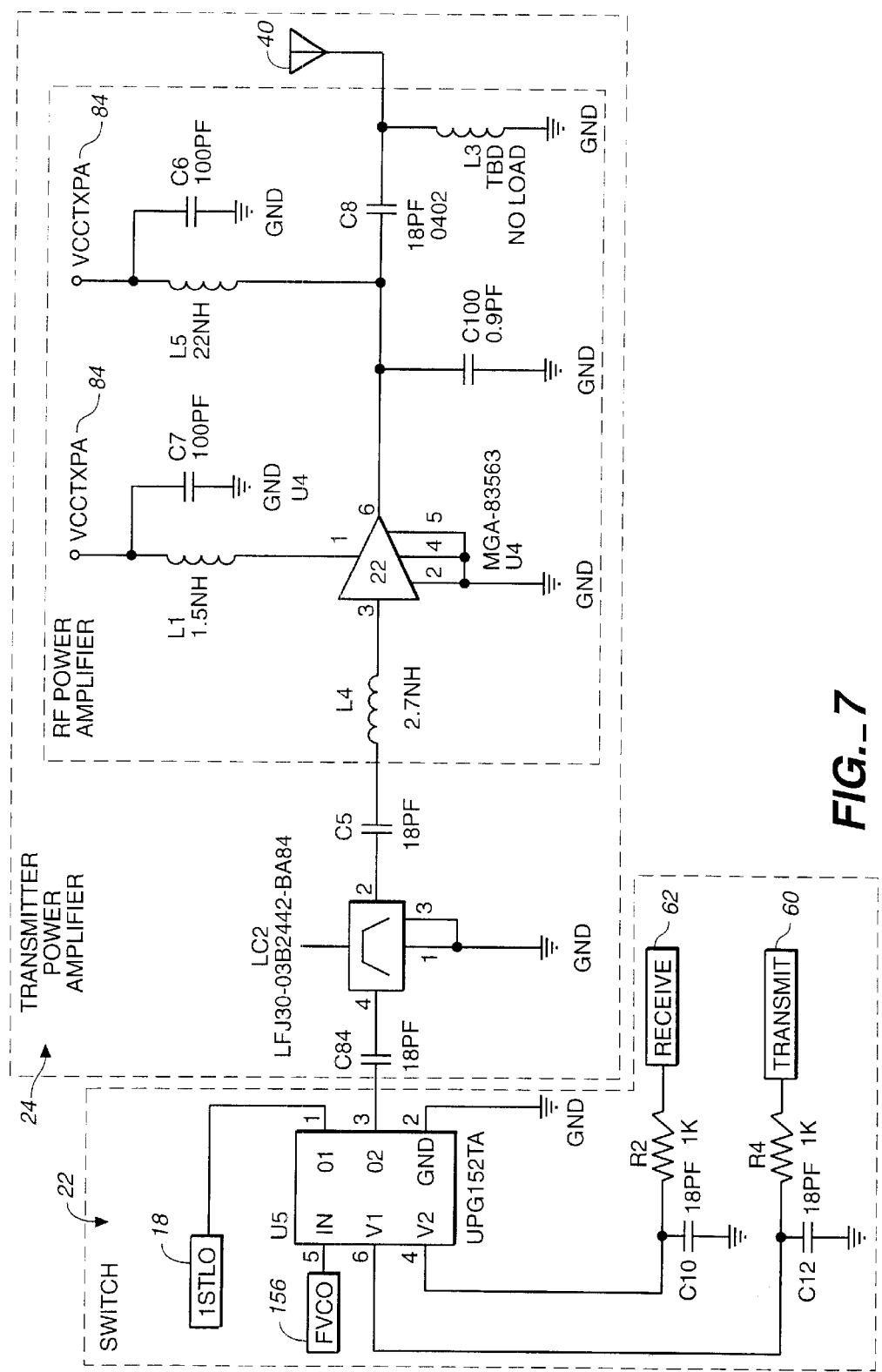
FIG._7

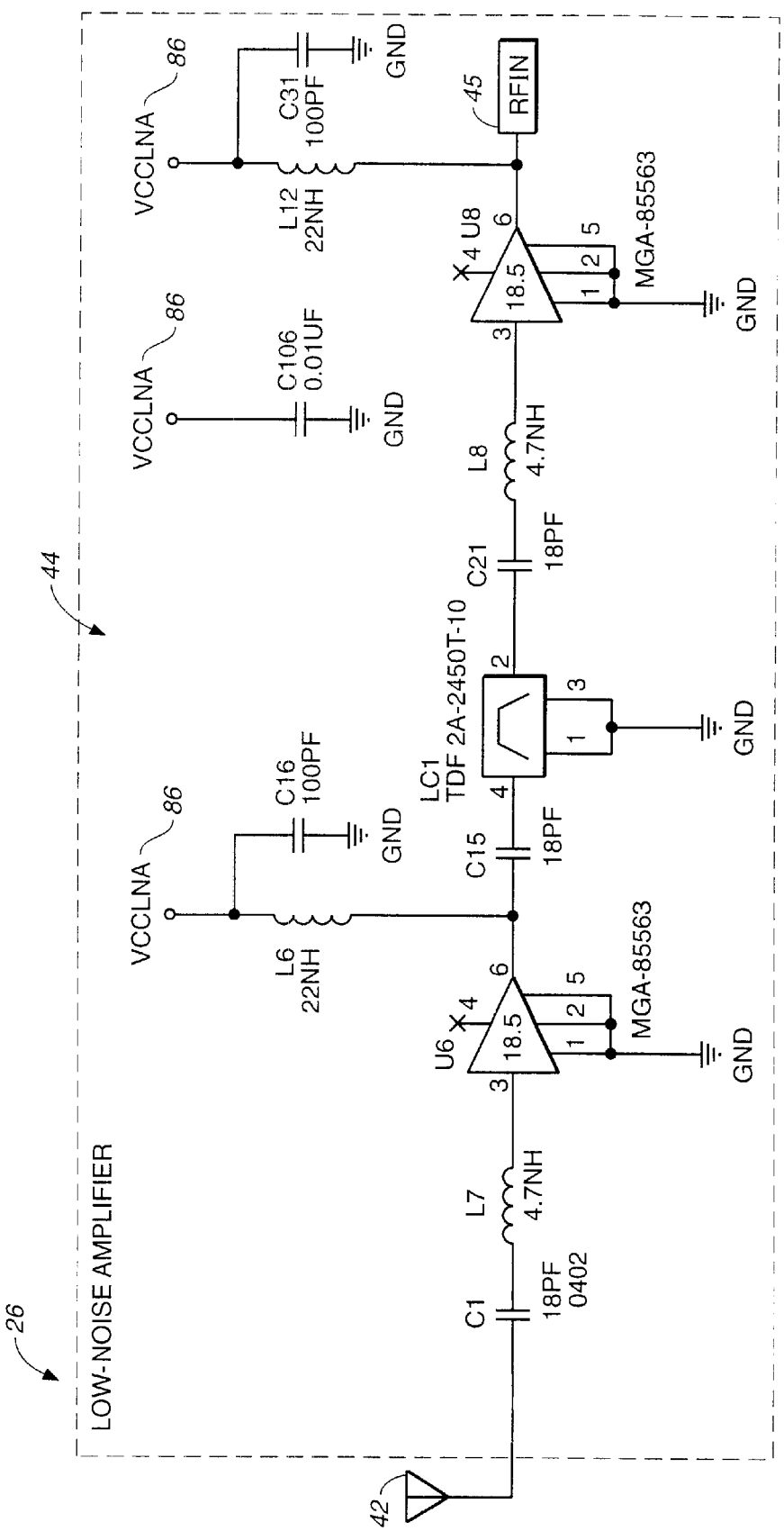
FIG._8

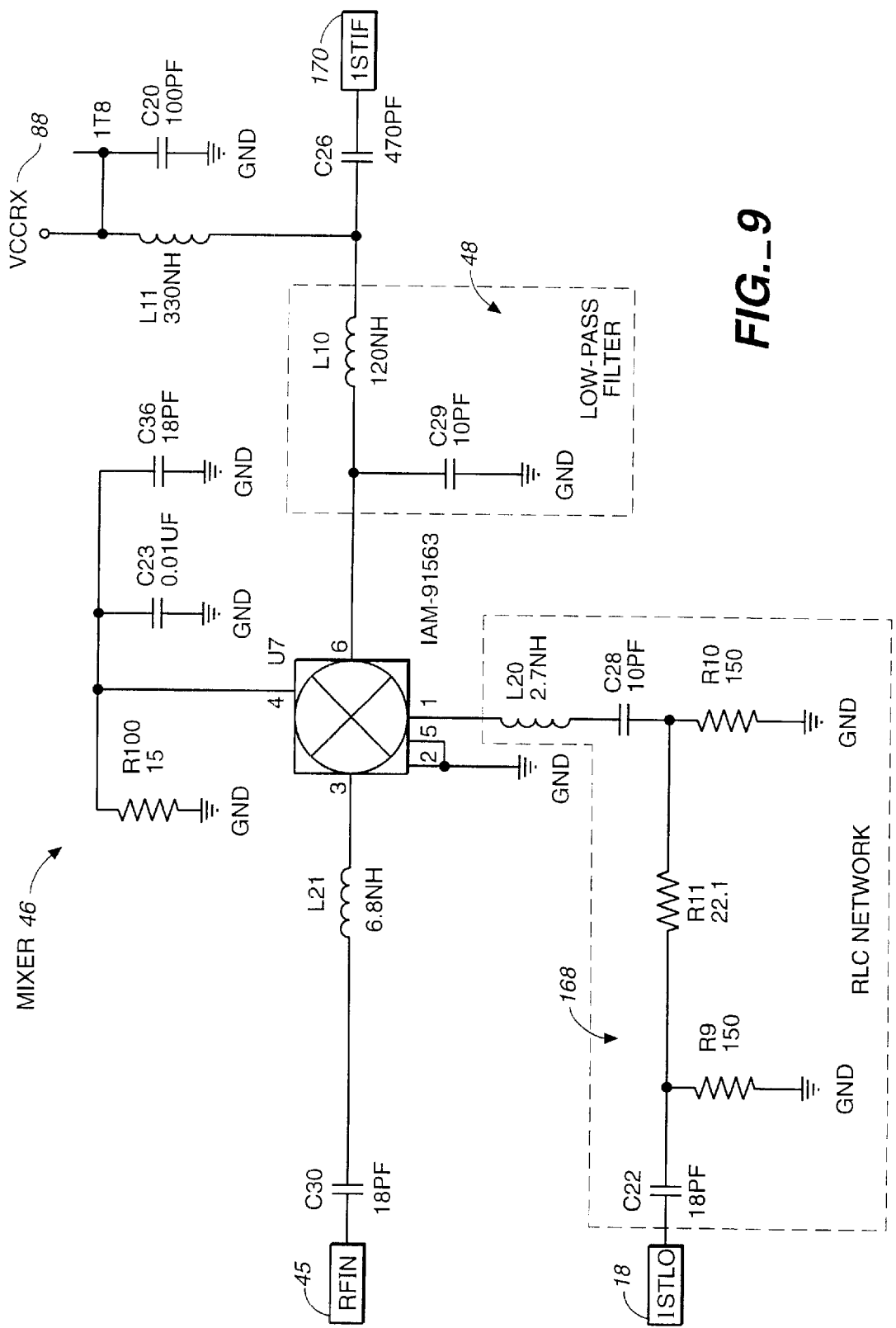
FIG._9

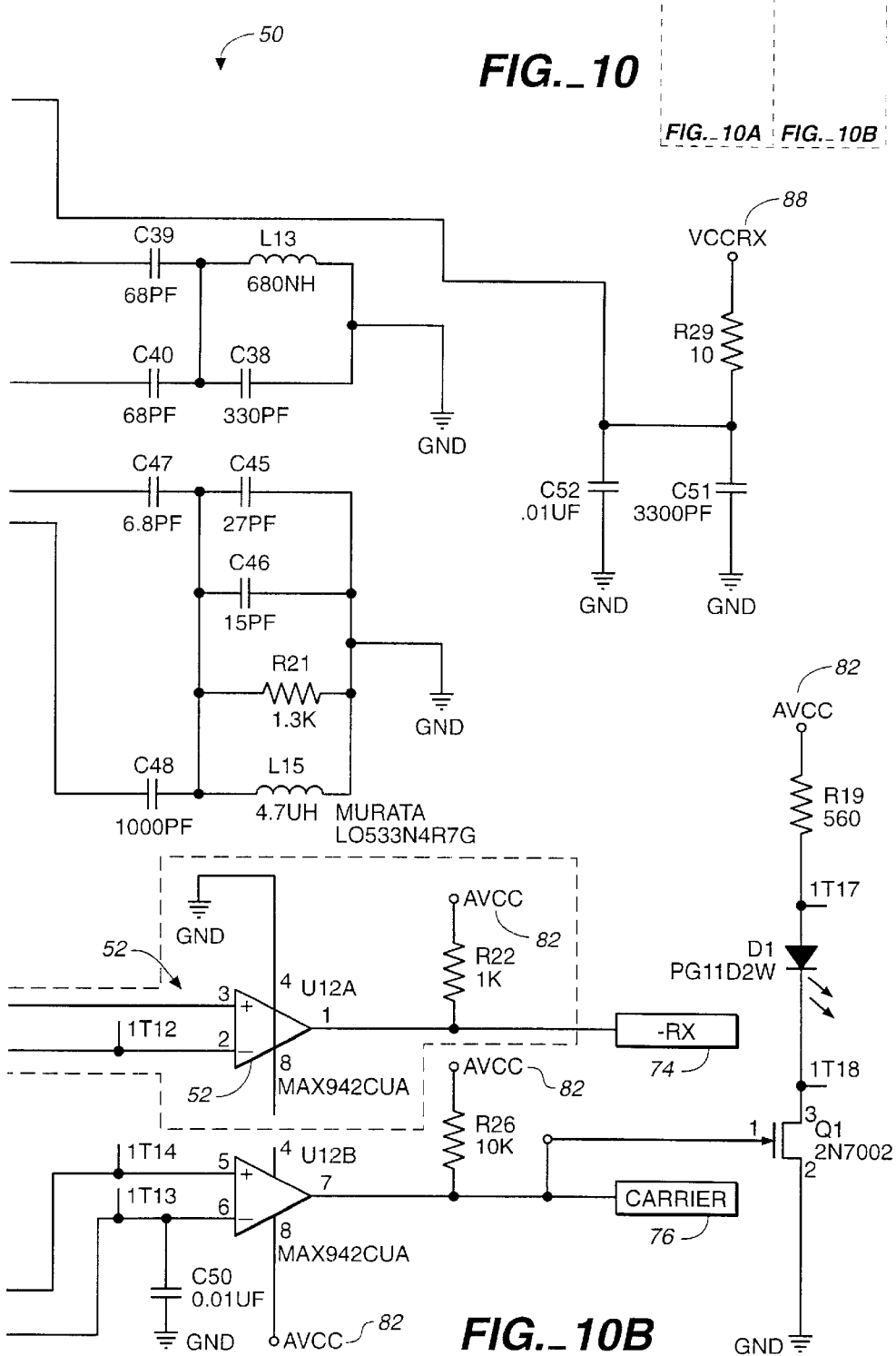
FIG._10
FIG._10B

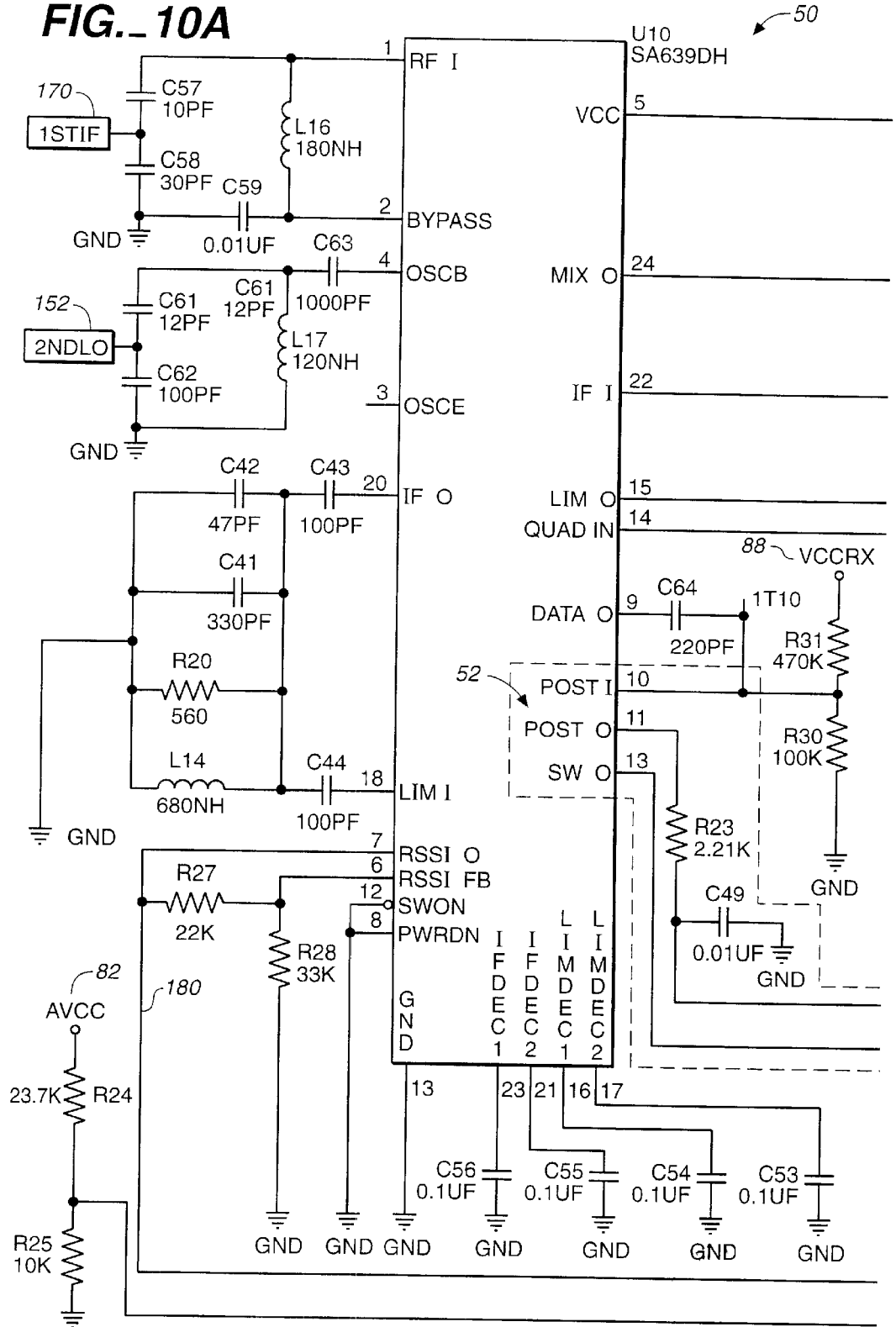
FIG._10A

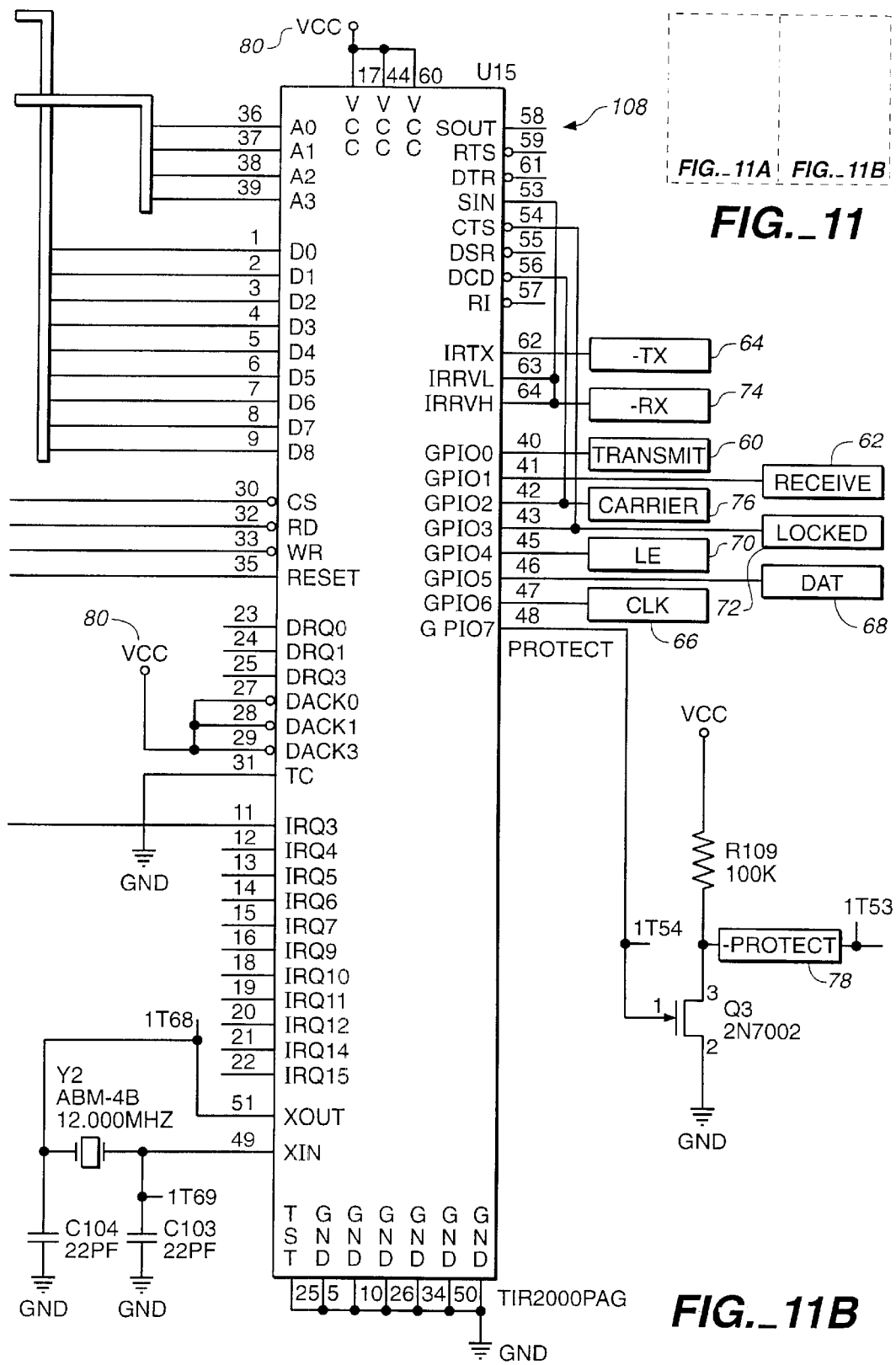
FIG._11B

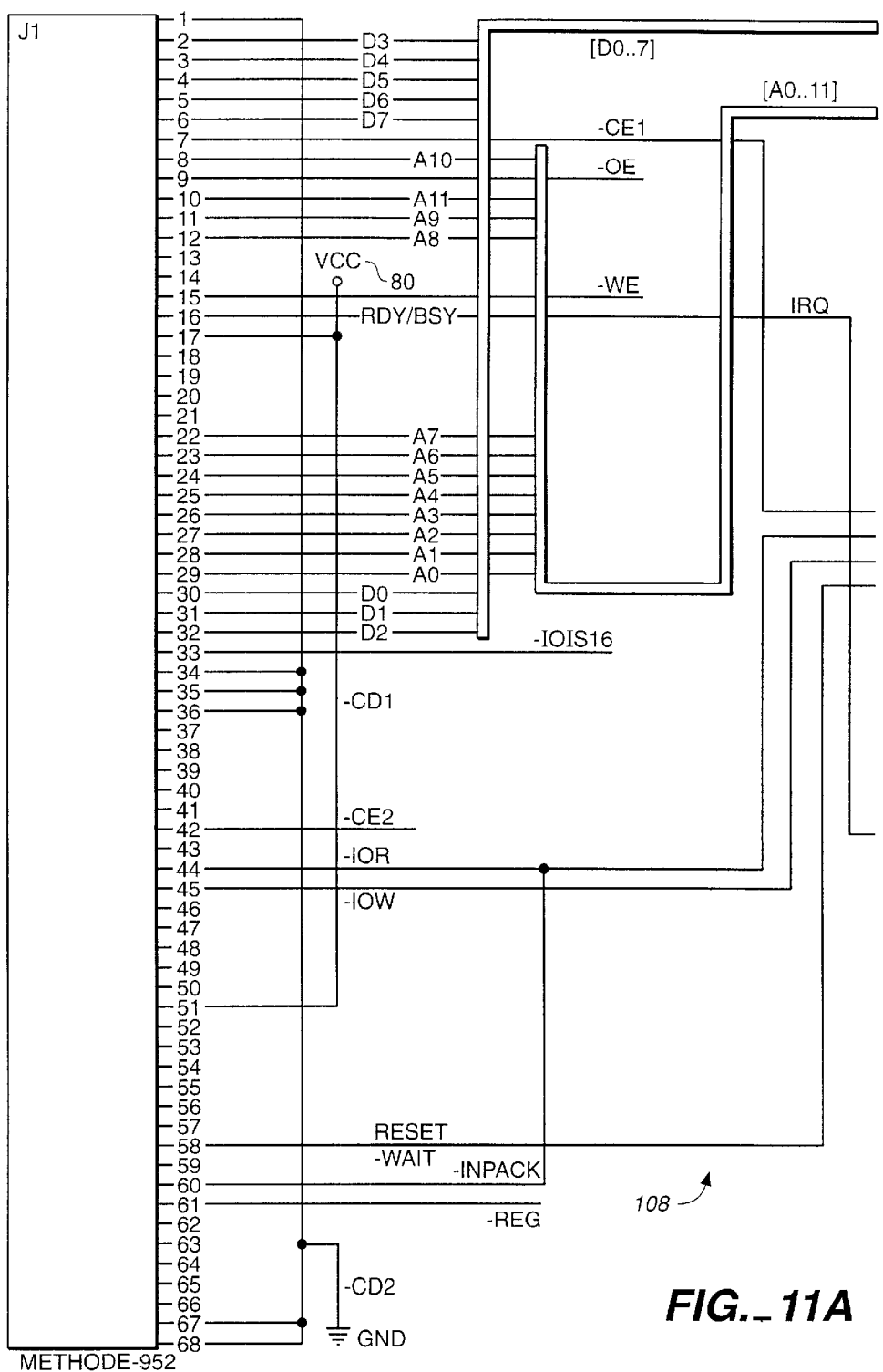
FIG._11A

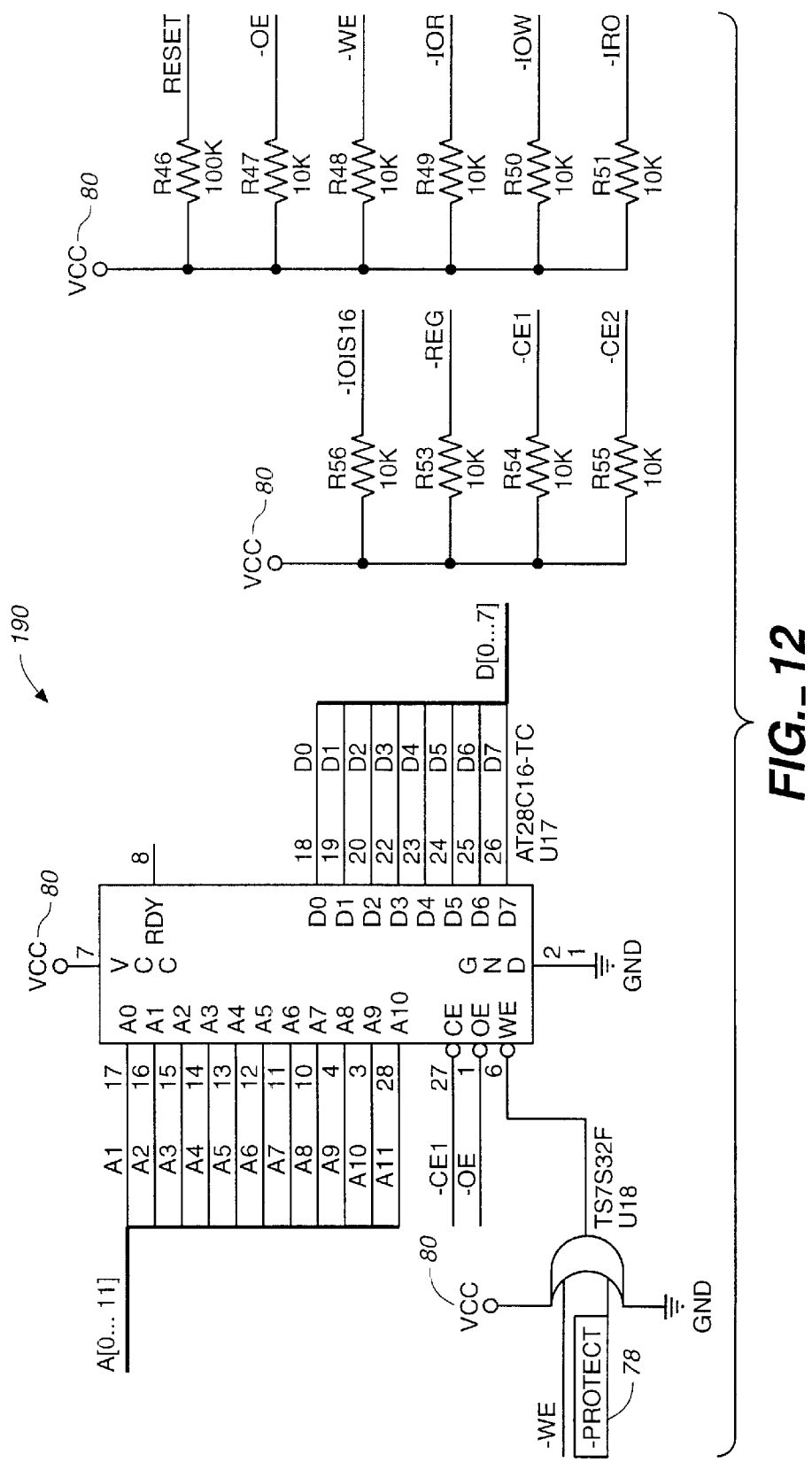
FIG._12

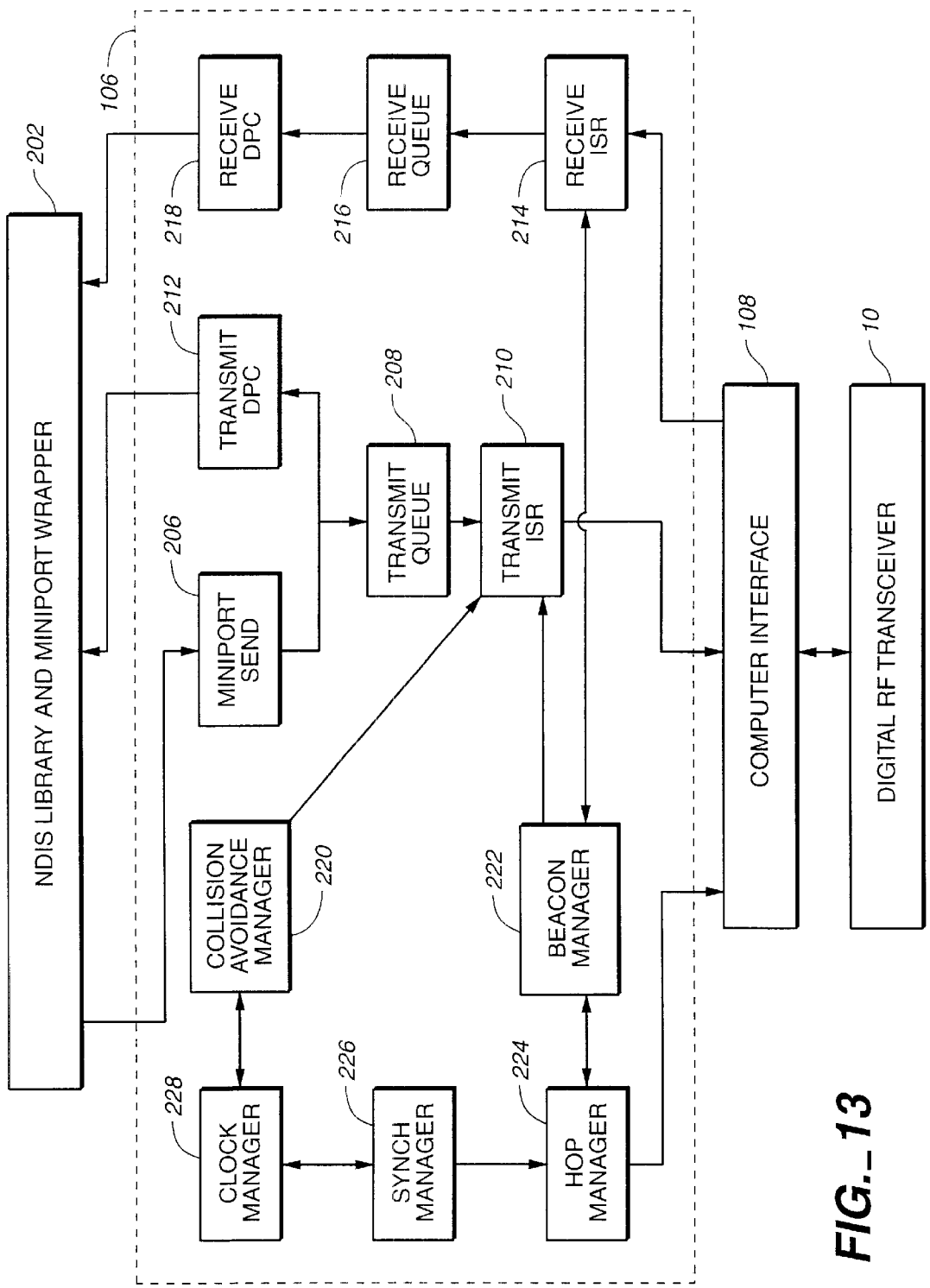
FIG._13

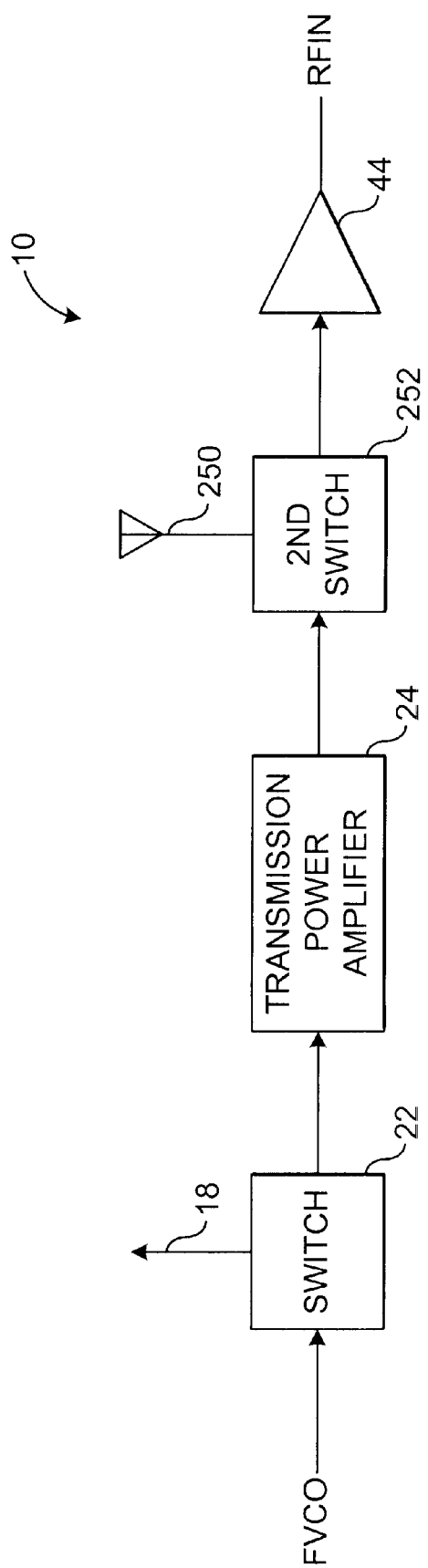
FIG._14

DIGITAL RADIOFREQUENCY TRANSCEIVER

This application is a continuation of U.S. Ser. No. 09/127,087, filed Jul. 31, 1998 (now abandoned) and claims the benefit of U.S. Provisional Application No. 60/061,940, filed Oct. 14, 1997 which are hereby incorporated by reference in their entirety.

BACKGROUND

This invention relates to wireless digital communication.

With ownership of home computers increasing, many households now have more than one computer. Purchasing separate peripherals (printers, scanners, modems, removable storage media) for each computer can be expensive and wasteful, when often only one of each peripheral may be needed. Also, households typically provide only one phone line for use by computer modems, requiring users of multiple computers to take turns accessing the on-line services. A home-based local area network (LAN) would allow the computers to share these peripherals, but most inexpensive networking hardware currently available requires cabling to physically connect the computers. As multiple-home-computer users often keep their computers in separate rooms, use of cable-based networking requires running cables through the house walls. This, in addition to the complications of administering network routers or hubs, has discouraged home use of current networking technology.

Some LAN technologies do not depend on re-wiring homes. Some use existing wiring, such as power lines or phone lines. To date, these technologies can experience interference and security problems (for example, power lines are typically shared with other nearby homes). In addition, existing wired LANs typically do not permit mobile access to the network by portable laptop computers. Wireless LANs (WLANs) have also been pursued for networking personal computers. For example, infrared-based networks have been developed, particularly in work-place environments for communication with mobile personal digital assistants (PDAs).

Digital radio communication has also been explored for WLANs. In 1985, the FCC established regulations to allow unlicensed use of certain bands if spread-spectrum (SS) techniques are used. In SS transmission, the energy radiated during transmission is spread across a wide spectrum of frequencies (or "channels") and is therefore less likely to cause substantial interference with other radio communications. FCC SS regulations allow greater transmission of power to be used without special licensing, increasing the attainable range of communications for unlicensed systems.

Two principal SS transmission techniques include direct-sequence (DS) and frequency-hopping (FH). In DSSS, spreading is achieved through multiplication of the data by a binary pseudo-random sequence whose chipping rate is many times the data rate. In FHSS, the carrier frequency remains at a given channel for a duration of data transmission, and then "hops" to a new channel elsewhere within the spreading bandwidth.

DSSS allows for coherent demodulation, in which the receiver exploits knowledge of the carrier's phase reference to detect the encoded signals. With FHSS, however, phase coherence is difficult to maintain between hops. Non-coherent demodulation results in the advantage of reduced complexity, but at a cost of an increased probability of error. FHSS typically enables high data rates to be achieved without requiring the high-speed logic that an equivalent DSSS system would require. Also, a FHSS system can employ frequency diversity, which combats multipath fading by transmitting data at multiple frequencies, increasing the likelihood that data will be transmitted and received uncorrupted. The data requirements of digital communications equipment is increasing as the typical size of data files becomes larger. Complex modulation schemes have been used to handle higher bandwidth requirements and more efficiently use the bandwidth allocated to RF devices. However, existing modulation schemes can be either very logic-intensive or require very accurate and expensive clock references. An example of the former type of scheme is differential quadrature phase shift keying (DQPSK), in which complex (IQ) demodulation is required to recover the encoded data. An example of the latter type of scheme is frequency shift keying (FSK), in which small changes in frequency are used to represent the encoded data. The change in frequency in FSK is usually very small and the receiving system may have difficulty determining whether a particular shift in frequency it detects represents real data or an offset between transmitter and receiver reference clocks.

SUMMARY

In general, in one aspect, the invention features a method for radiofrequency (RF) transmission of digital information including generating an RF signal using a voltage-controlled oscillator (VCO), stabilizing the RF signal from the VCO by providing an error signal from a phase-locked loop (PLL) to an input of the VCO, and combining the digital information with the error signal of the PLL input to the VCO, thereby causing variations in frequency of the RF signal from the VCO that represent the digital information.

Embodiments of the invention may include one or more of the following features. The RF signal can be broadcast. The error signal of the PLL can be provided to the VCO by a loop filter. The rate of change of the digital information can be faster than a response time of the PLL. The digital information can be encoded such that it has a duty cycle which is substantially constant over the response time of the PLL. The digital information can be encoded according to the pulse position modulation (PPM) scheme defined by the IrDA 4PPM data encoding standard. A channel frequency of the RF signal can be changed according to a series of channel frequencies, wherein the series of channel frequencies is determined by generating a series of at least a first and a second channel-select signal, each channel-select signal comprising a frequency-valid indicator and a frequency-specification indicator, sending each channel-select signal in turn to the PLL, and changing the tuning frequency of the PLL according to the frequency specification of the first channel-select signal upon receiving the frequency-valid indicator of the second channel-select signal. The number of distinct channel frequencies in the series of channel frequencies can be a prime number. The series of channel frequencies can be repeated upon completion, and no channel can be used more than once in each repetition of the series of channel frequencies. The transmitted RF signal can be received, demodulated, a signal level threshold can be determined from the demodulated RF signal, and the demodulated RF signal can be compared to the signal level threshold to regenerate the digital information from the demodulated RF signal. The RF signal output of the VCO can be used as a local oscillator to demodulate the received RF signal.

In general, in another aspect, the invention features a method for RF transmission of digital information including generating an RF signal using a voltage-controlled oscillator (VCO), stabilizing the RF signal from the VCO by providing an error signal from a phase-locked loop (PLL) to an input of the VCO, encoding the digital information such that it has a duty cycle which is substantially constant over the response time of the PLL, forming a data packet containing the encoded digital information, and combining the data packet with the error signal of the PLL input to the VCO, thereby causing variations in frequency in the RF signal from the VCO that represent the data packets.

Embodiments of the invention may include one or more of the following features. The data packet can have a duty cycle which is substantially constant over the response time of the PLL. The digital information can be encoded and the packets can be formed according to the pulse position modulation (PPM) scheme defined by the IrDA 4PPM data encoding standard.

In general, in another aspect, the invention features a method for receiving digital information sent by an RF transmitter using the IrDA 4PPM data encoding standard including receiving a transmitted RF signal, demodulating the RF signal, determining a signal level threshold from the demodulated RF signal, comparing the demodulated RF signal to the determined signal level threshold to thereby regenerate IrDA-formatted data from the demodulated RF signal, and reproducing the digital information by decoding the IrDA-formatted data.

In general, in another aspect, the invention features a method of implementing communication between a plurality of host computers using spread-spectrum RF transmission, including exchanging digital information between a first host computer and a first RF transceiver, encoding the digital information using pulse position modulation (PPM) according to the IrDA 4PPM data encoding standard, forming a data packet from the encoded digital information according to the IrDA 4PPM data encoding standard, generating an RF signal using a first voltage-controlled oscillator (VCO), stabilizing the RF signal from the first VCO by providing an error signal from a first phase-locked loop (PLL) to an input of the VCO, combining the data packet with the error signal of the first PLL input to the VCO, thereby causing variations in frequency in the RF signal from the first VCO that represent the data packet, broadcasting the RF signal to a second RF transceiver, demodulating the RF signal at the second RF transceiver, determining a signal level threshold from the demodulated RF signal, comparing the demodulated RF signal to the determined signal level threshold to thereby regenerate the data packets from the demodulated RF signal, reproducing the digital information by decoding the data packet, and exchanging the digital information with a second host computer.

Embodiments of the invention may include one or more of the following features. Media access control (MAC) functions can be placed in host computer software at both the first and second host computers. The possibility that multiple transceivers will transmit simultaneously can be reduced by each transceiver waiting a pseudorandom time from the end of the last transmission or reception before transmitting. The pseudorandom time can be determined by a pseudorandom number generator, by clock drift of one host relative to another, or by interrupts generated by other operations of the host computers.

In general, in another aspect, the invention features an apparatus for RF transmission of digital information including a VCO, the VCO arranged to generate an RF signal, a PLL, the frequency input of the PLL coupled to the RF signal output of the VCO, an encoder, the encoder arranged to convert the digital information into a form where it has a data rate faster than a response time of the PLL, and a coupler, the coupler coupling both the error signal output of the PLL and the encoded digital information to an input of the VCO.

Embodiments of the invention may include one or more of the following features. An antenna can be coupled to the RF signal output of the VCO. The coupler can be a loop filter. The encoder can be arranged to convert the digital information into a form where it has a duty cycle which is substantially constant over the response time of the PLL. The encoder can convert the digital information according to the pulse position modulation,(PPM) scheme defined by the IrDA 4PPM data encoding standard. A channel frequency selector can change a channel frequency of the RF signal according to a series of channel frequencies, wherein the selector determines the series of channel frequencies by the selector generating a series of at least a first and a second channel-select signal, each channel-select signal comprising a frequency-valid indicator and a frequency-specification indicator, the selector sending each channel-select signal in turn to the PLL, and the PLL changing its tuning frequency according to the frequency specification of the first channel-select signal upon receiving the frequency-valid indicator of the second channel-select, signal. The number of distinct channel frequencies used by the selector in the series of channel frequencies can be a prime number. The selector can repeat the series of channel frequencies upon completion, and not use any channel more than once in each repetition of the series of channel frequencies.

In general, in another aspect, the invention features an apparatus for RF reception of IrDA 4PPM-encoded digital information including an antenna, the antenna receiving a transmitted RF signal containing the IrDA 4PPM-encoded digital information, a low-noise amplifier, the low-noise amplifier amplifying and filtering the received RF signal, a local RF oscillator, the local RF oscillator configured to produce a frequency in proximity to the channel frequency of the received RF signal, a mixer, the inputs of the mixer coupled to the output of the low-noise amplifier and the local RF oscillator, an FM demodulator, the input of the FM demodulator coupled to the output of the mixer, and a decoder, the decoder extracting the digital information from the demodulated RF output of the FM demodulator according to the pulse position modulation (PPM) scheme defined by the IrDA 4PPM data encoding standard.

In general, in another aspect, the invention features an apparatus for RF transmission and reception of digital information including a VCO, the VCO arranged to generate an RF signal, a PLL, the frequency input of the PLL coupled to the RF signal output of the VCO, an encoder, the encoder arranged to convert the digital information into a form where it has a data rate faster than a response time of the PLL, a coupler, the coupler coupling both the error signal output of the PLL and the encoded digital information to an input of the VCO, a switch, the switch configured to couple its input to at least one of its outputs, a first antenna coupled to a first output of the switch, the first antenna arranged to transmit the RF signal, an antenna arranged to receive a transmitted RF signal, a low-noise amplifier coupled to the antenna, the low-noise amplifier amplifying and filtering the received RF signal, a mixer, one input of the mixer coupled to the output of the low-noise amplifier and another input of the mixer coupled to a second output of the switch, an FM demodulator, the input of the FM demodulator coupled to the output of the mixer, and a decoder, the decoder reproducing the digital information from the demodulated RF output of the FM demodulator.

Embodiments of the invention may include one or more of the following features. The antenna arranged to receive the transmited RF signal can be the same antenna as the first antenna, and the apparatus can include a power amplifier, the input of the power amplifier coupled to the first output of the first switch, and a second switch, the second switch configured to couple the first antenna either to the input of the low-noise amplifier for reception, or to the output of the power amplifier for transmission. The decoder can reproduce the digital information from the demodulated RF output of the FM demodulator according to the pulse position modulation (PPM) scheme defined by the IrDA 4PPM data encoding standard.

Advantages of the invention may include one or more of the following. A 2.4 Ghz transceiver can be coupled to a number of personal computers to form a robust, low cost RF WLAN. The RF WLAN can support relatively high-bandwidth digital signal communication between computers or other devices. The RF transceiver does not require generating both a carrier signal and an information bearing signal that are then mixed, requiring an additional (relatively expensive) mixer and filter. The approximately 2.4 Ghz signal transmitted by the transceiver is directly generated by a relatively simple VCO and PLL feedback circuit whereby digital information is directly injected into the feedback circuit. By employing a particular encoding scheme used in infrared communications to encode the digital information injected into the feedback circuit, frequency drifts that would otherwise be expected by such direct injection can be avoided. More than one transceiver can be coupled to the same computer to increase data throughput by splitting data packets among more than one communications channel. By placing most Medium Access Control (MAC) features in software instead of hardware, relatively cheap and available CPU cycles can be used to perform MAC operations instead of additional MAC circuitry in the transceiver.

Other features and advantages of the invention will become apparent from the following description and from the claims.

DRAWINGS

FIG. 1 is a block diagram of a digital transceiver.

FIG. 2 is a block diagram of an RF WLAN employing digital transceivers.

FIG. 3 is a schematic diagram of a power supply used by the digital transceiver.

FIG. 4 is a schematic diagram of a phase-locked loop and a loop filter used by the digital transceiver.

FIG. 5 is a schematic diagram of a clock- and frequency-reference generator used by the digital transceiver.

FIG. 6 is a schematic diagram of a voltage-controlled oscillator and filtering elements used by the digital transceiver.

FIG. 7 is a schematic diagram of an RF switch, an RF power amplifier, and an antenna used by the digital transceiver.

FIG. 8 is a schematic diagram of an antenna and a low-noise amplifier used by the digital transceiver.

FIG. 9 is a schematic diagram of an RF mixer and filtering elements used by the digital transceiver.

FIGS. 10A and 10B are schematic diagrams of a wideband FM demodulator used by the digital transceiver.

FIGS. 11A and 11B are schematic diagrams of a computer interface to the digital transceiver.

FIG. 12 is a schematic diagram of a CIS ROM used in the digital transceiver.

FIG. 13 is a functional block diagram of a device driver for the digital transceiver.

FIG. 14 is a schematic diagram of an embodiment using a single antenna.

DESCRIPTION

FIG. 1 shows a digital radio-frequency transceiver capable of generating and receiving a radio-frequency signal carrying digital information, which includes transmitter 12, receiver 14, and power supply 16.

Transmitter 12 includes local RF oscillator 20, switch 22, and transmitter power amplifier 24. Local RF oscillator 20 includes a phase-locked loop (PLL) 30, which tunes the carrier frequency of RF transceiver 10 (controlled by its control signals CLK 66, DAT 68, and LE 70 as described further below). Loop filter 32 couples the error signal of PLL 30 to voltage-controlled oscillator (VCO) 34. The radio-frequency output 35 of VCO 34 is coupled to the frequency input of PLL 30, and loop filter 32 serves to stabilize the resulting feedback loop between PLL 30 and VCO 34. RF output 35 of VCO 34 is also coupled to switch 22 by band-pass filter 36. Digital information to be carried on RF output 35 of VCO 34 is injected directly into loop filter 32 on line TX 64. Switch 22 couples RF output 35 of VCO 34 to the input of transmitter power amplifier 24 when signal TRANSMIT 60 is asserted and signal RECEIVE 62 is not asserted.

Transmitter power amplifier 24 comprises filtering elements (capacitor C84, band-pass filter LC2, and capacitor C5), RF power amplifier 38, and transmission antenna 40. Switch 22 is coupled by capacitor C84 to band-pass filter LC2, which in turn is coupled to RF power amplifier 38 by capacitor C5. The output of RF power amplifier 38 is coupled to transmission antenna 40.

Receiver 14 includes an RF receiver 26 and a demodulator 28. RF receiver 26 includes a receiving antenna 42, which receives a broadcast RF signal carrying digital information and supplies it to low-noise amplifier 44. Low-noise amplifier 44 includes a band-pass filter that blocks frequencies other than those in the selected band of transmission channels. The output of low-noise amplifier 44 is coupled to demodulator 28. Demodulator 28 includes mixer 46, which accepts as its inputs both a carrier frequency input on line 18 and output 45 of low-noise amplifier 44. Local RF oscillator 20 of transmitter 12, coupled through switch 22, supplies the current carrier frequency to mixer 46 on line 18. In order to provide the reference carrier frequency, data transmission on line TX 64 ceases, the current transmission channel frequency is selected using control signals CLK 66, DAT 68, and LE 70 of PLL 30, and switch 22 is then directed to send its input (the filtered output of VCO 34) to line 18. The output of mixer 46 is coupled to low-pass filter 48, the output of which is an intermediate frequency (IF) signal 49 encoded with the digital information. The output of low-pass filter 48 is coupled to wideband FM demodulator 50. Wideband FM demodulator 50 asserts a carrier-detect signal CARRIER 76 when it has detected and is demodulating a signal. The baseband output of wideband FM demodulator 50 is AC-coupled to comparator 52 by coupling capacitor C64. Comparator 52 integrates the received and demodulated AC-coupled baseband signal to adaptively determine a signal-level threshold, and by comparing the AC-coupled baseband signal to the signal-level threshold, comparator 52 reproduces on line RX 74 the digital information that was encoded in the received RF signal.

Power supply 16 generates the various power voltages required by transmitter 12 and receiver 14. From a single 5-Volt power supply VCC 80, four analog power supply voltages are generated: AVCC 82, VCCTXPA 84, VCCLNA 86, and VCCRX 88. Different components of transceiver 10 are powered by different power supplies to conserve power, minimize noise, and improve stability.

FIG. 2 shows an RF Network 100 including two hosts 102A and 102B (e.g., two personal computers located in different rooms in a home), where each host 102 has a CPU 104, a transceiver device driver 106, and an interface 108 that couples Host 102 with an RF Transceiver 10. (typically coupled to or within Host 102).

Transmission antenna 40A of Host 102A can send digital information via an RF transmission 101A to receiving antenna 42B of Host 102B and vice versa. Transceiver device driver 106 handles all routing of data packets between applications running on CPU 104 and RF transceiver 10. Transceiver device driver 106 controls this routing by sending and receiving control and data signals to and interface 108, which then generates transceiver control lines 110, described further below, which control the. operation of transceiver 10.

FIG. 3 shows power supply circuit 16 in greater detail. Analog power circuit 120 creates 5-Volt AVCC 82 from VCC 80, decoupled by capacitors C82, C83 and C105. In one embodiment, resistors R105 and R107 can have positive resistances to couple C82 and C83 to "de-Q" any resonances inadvertently created. In the embodiment shown, resistors R105 and R107 are shown as shorts with zero resistance and can be omitted. 3-Volt analog power supply lines VCCTXPA 84, VCCLNA 86, and VCCRX 88 are created from AVCC 82 using low-noise voltage regulators U3, U16, and U11, respectively. Each 3-Volt analog power supply 122, 124, and 126 powers separate portions of the transceiver circuitry, and separate voltage regulators U3, U16, and U11 minimize noise between circuits.

Transmitter PA power circuit 122 creates VCCTXPA 84, first by inputting analog power AVCC 82 into voltage regulator (Micrel MIC5215-3.0BMS) U3, which is bypassed by capacitors C2 and C102 to prevent instability. Voltage regulator U3 is chosen to provide an output of 3 Volts to VCCTXPA 84, and includes an enable/shutdown control input EN. Signal TRANSMIT 60 controls U3, such that when signal TRANSMIT 60 is not asserted, VCCTXPA 84 is disabled, and power is not supplied to transmitter power amplifier 24, saving power when not transmitting RF signals.

Receiver low-noise amplifier power circuit 124 and receiver demodulator power circuit 126 are similar to transmitter. PA power circuit 122, and each provides an output of 3 Volts. Low-noise amplifier power circuit 124 employs voltage regulator (Micrel MIC5205-3.0MBS) U16, and receiver demodulator power circuit 126 employs voltage regulator (Micrel MIC5205-3.0MBS) U11. Both voltage regulators U11 and U16 have an enable/shutdown control input EN. Signal RECEIVE 62 is coupled to the control inputs EN of U16 and U11, such that when signal RECEIVE 62 is not asserted, both VCCLNA 86 and VCCRX 88 are disabled, and power is thereby not supplied to low-noise amplifier 44, mixer 46, or FM demodulator 50 of receiver 14, conserving power when not receiving RF transmissions. Voltage regulators U16 and U11 are coupled to bypass capacitors C91, C92, and C101, and to C37 and C60, respectively.

FIG. 4 shows in more detail circuits for PLL 30 and loop filter 32 (of local RF oscillator 20 in transmitter 12). PLL 30 employs digital PLL synthesizer (Motorola MC12210) U19.

The tuning frequency of digital PLL U19 can be selected clocking in a numerator and divisor through control lines CLK 66, DAT 68, and LE 70. Digital PLL U19 is powered by AVCC 82 and relies on a frequency reference supplied on line FREF 140. Digital PLL U19 accepts a frequency input on line FPLL 142, provides an output error signal VT 144, and provides a phase-comparator output signal LD 146 which is coupled to lock detect circuit 148. Resistor R32 and capacitor C66 of lock detect circuit 148, perform an integrating function and are coupled to resistors R33 and R34 through transistor Q2. Only when the digital PLL U19 has acquired a lock on its frequency input on line FPLL 142 will phase-comparator output signal LD 146 be a nearly-constant HIGH, causing the (negative-true) signal LOCKED 72 to be asserted by lock detect circuit 148.

Loop filter 32 includes resistor R38 and capacitors C71 and C72. Error signal VT 144, the output of digital PLL U19, is filtered by loop filter 32. Loop filter 32 is tied to ground by resistor R37 and capacitor C69. By coupling line TX 64 to loop filter 32 through resistor R39 and having the resistance of resistor R37 be a small but positive value, the "ground" reference of loop filter 32 is shifted higher whenever line TX 64 is HIGH. Line TX 64 thus creates small deviations in error signal VT 144, which directly modulates the RF frequency output of VCO 34 with any digital information provided on line TX 64.

In one embodiment, modulation of the VCO output is accomplished by moving its input by 5.28 mV steps. This voltage differential is sufficient to cause a 750 kHz change in output frequency. If frequency hops are 1 MHZ, then a "1" is represented by an excursion of about ¾ of a hop from the current frequency (which represents a "0").

FIG. 5 shows a circuit for producing frequency and clock references on lines FREF 140 and 2NDLO 152, respectively. A 20 MHZ crystal Y3 is coupled to clock generator (ICS/ Microclock ICS525) U14. Clock generator U14 provides a buffered 20 MHZ clock output to frequency reference line FREF 140 and a buffered 120.588 MHZ clock output through resistor network 154 to line 2NDLO 152. Resistor network 154 includes resistors R41, R42, and R43, and in the embodiment shown, is designed to attenuate the clock output by 3 dB to meet the clock input requirements of wideband FM demodulator 50.

FIG. 6 shows circuits for VCO 34 and band-pass filter 36 in more detail. VCO 34 employs VCO (Z-Communications SMV2385L) OSC1. VCO OSC1 has a frequency range from 2285 to 2484.5 MHZ. PLL U19 can control VCO OSC1 over its entire range. The 3-Volt power supply for VCO OSC1 is supplied by voltage regulator (Micrel MIC5205-3.0MBS) U9, which is bypassed by capacitors C24, C25, C27, and C33 to prevent oscillations. The enable input EN of voltage regulator U9 is coupled to AVCC 82 to always enable the power output of the voltage regulator U9, ensuring frequency stability. The RF output of VCO OSC1 couples to resistors R13, R14, R15, and R16, forming a resistive power splitter 160 that minimizes the detrimental effects of load mismatch on the performance of VCO OSC1. Capacitor C34 couples the RF signal from resistive power splitter 160 to line FPLL 142, which then couples the output RF signal back to the frequency input FI of PLL 30 (FIG. 4), completing the feedback loop between PLL 30 and VCO 34. Resistive power splitter 160 also supplies RF signal 35 to band-pass filter 36. Band-pass filter 36 comprises low-pass filter (Toko LTF32161-F2R4G) LC3, inductor L19, and capacitor C35, where inductor L19 and capacitor C35 form a high-pass filter, such that band-pass filter 36 passes only those RF frequencies in the transmission band of channels to line FVCO 156.

FIG. 7 shows switch 22 and transmitter power amplifier 24 in more detail. Switch 22 employs an L-Band SPDT GaAs MMIC switch (NEC uPG152TA) U5. Switch U5 couples line FVCO 156 (carrying the filtered RF signal from VCO 34) to either mixer 46 or to transmitter power amplifier 24, or to neither, depending upon the state of signals TRANSMIT 60 and RECEIVE 62. When signal TRANSMIT 60 is asserted but RECEIVE 62 is not, line EFVCO 156 is coupled to capacitor C84 of transmitter power amplifier 24, and then to band-pass filter (Murata LFJ30-03B2442-BA84) LC2. When signal RECEIVE 62 is asserted but TRANSMIT 60 is not, line FVCO 156 is coupled to line 1STLO 18, which couples switch U5 to mixer 46 of receiver 14. If neither TRANSMIT 60 or RECEIVE 62 are asserted, or both are, switch U5 does not couple line FVCO 156 to anything. Therefore, depending on which signals are asserted (TRANSMIT 60 or RECEIVE 62), filtered RF signal output FVCO 156 of VCO 34 is either passed to the next stage of transmitter 12 or sent to receiver 14, but switch U5 will not do both, an advantage discussed further below.

Transmitter power amplifier 24 includes power amplifier (HP MGA-83563) U4. Band-pass filter LC2 couples to power amplifier U4 through capacitor C5 and inductor L4. 3-Volts power from VCCTXPA 84 is supplied to amplifier U4 by inductors L1 and L5, which are bypassed by capacitors C7 and C6, respectively. Capacitor C8 couples the output of power amplifier to transmission antenna 40, thus transmitting the amplified (by about 20 dB) RF signal carrying digital information.

FIG. 8 shows RF receiver 26 in more detail. An RF signal carrying digital information is received by receiving antenna 42, and is coupled to low-noise amplifier 44 through capacitor C1 which forms a high-pass filter for the RF signal. Low-noise amplifier 44 comprises a two-stage low-noise amplifier, using two GaAs RFIC amplifiers (HP MGA-85563) U6 and U8. The cascaded gain of the two amplifiers U6 and U8 is about 30 dB, giving about 5 dB of margin for an IF sensitivity of about –85 dBm. The two amplifiers U6 and U8 are coupled by band-pass filter (Toko TDF2A-2450T-10) LC1. Inductors L6 and L12 are used to supply amplifiers U6 and U8, respectively, with 3 Volts from VCCLNA 86. Bypass capacitors C16, C31, and C106 filter VCCLNA 86. The output of amplifier U8 is coupled to mixer 46 by line RFIN 45.

FIG. 9 shows mixer 46 in more detail. Down converter (HP IAM-91563) U7 frequency-shifts incoming RF signal output RFIN 45 to an intermediate-frequency (IF) signal. The output of amplifier U8 (of low-noise amplifier 44) on line RFIN 45 is coupled to input 3 of Down converter U7 through capacitor C30 and inductor L21. The current RF carrier frequency on line 1STLO 18 is coupled to Down converter U7 by RLC network 168. RLC network 168 matches impedances between output 18 of local RF oscillator 20 and the input of Down converter U7, and includes capacitors C22 and C28, resistors R9, R10, and R11, and inductor L20. On the intermediate-frequency output 6 of Down converter U7, capacitor C29 and inductor L10 form low-pass filter 48 to pass only the appropriate IF signal while blocking unwanted signals from Down converter U7. The IF signal is coupled to line 1STIF 170 by capacitor C26. Down converter U7 is powered by VCCRX 88 through inductors L10 and L11, and capacitor C20 is used to bypass VCCRX 88. Capacitors C23 and C36 bypass the source of Down converter U7, and resistor R100 is used to put Down converter U7 into its high linearity mode for better performance.

FIG. 10, comprising FIGS. 10A and 10B, shows wideband FM demodulator 50 in greater detail. Wideband FM demodulator 50 comprises mixer FM IF system (Philips SA639DH) U10, powered by VCCRX 88 through resistor R29, and bypassed by capacitors C51 and C52. Mixer FM IF system U10 has as its inputs the output of mixer 46, coupled by line 1STIF 170, and the 120.588 MHZ clock output generated by clock generator U14, coupled by line 2NDLO 152. The wideband data output DATA O of mixer FM IF system U10 is coupled to capacitor C64. Mixer FM IF system U10 includes an internal post-detection filter amplifier (not shown, but included in comparator 52) which receives the biased demodulated output of capacitor C64 at POST I and outputs a filtered signal at POST O and SW O. Resistors R30 and R31 provide a constant bias voltage to post-detection filter amplifier input POST I of mixer FM IF system U10, driving the baseband signal into the clipping region of the internal post-detection filter amplifier. Bias resistors R30 and R31 obtain their power from VCCRX 88.

Comparator 52 also includes amplifier U12A, configured as a comparator, and resistor R23 and capacitor C49, which act as an integrator to adaptively determine an average signal level threshold from the demodulated signal output. The average signal level threshold is stored on capacitor C49. Amplifier U12A compares the demodulated signal output to the average signal level threshold and, coupled to pull-up resistor R22, reproduces the encoded digital information carried by the received radio-frequency signal on line RX 74. Note that in the embodiment shown, comparator 52 is configured to make line RX 74 negative-true.

Mixer FM IF system U10 also includes a Receive Signal Strength Indicator (RSSI) output 180, which provides a voltage determined by the strength of the received IF frequency signal and feedback resistors R27 and R28. RSSI output 180 is coupled to amplifier U12B, configured as a comparator. RSSI output 180 is compared to a voltage threshold determined by AVCC 82 and resistors R24 and R25, and stored on capacitor C50. Amplifier U12B compares RSSI output 180 to the voltage threshold and, coupled to AVCC 82 by pull-up resistor R26, creates signal CARRIER 76. Signal CARRIER 76 couples to LED D1 through transistor Q1 such that, when signal CARRIER 76 is asserted, LED D1 illuminates to provide a visual indication that receiver 14 is receiving and demodulating a radio-frequency signal. LED D1 is coupled to AVCC 82 by resistor R19.

FIG. 11, comprising FIGS. 11A and 11B, shows interface 108 between bus J1 of a host computer 102 and digital RF transceiver 10 in greater detail. In the embodiment shown, interface 108 employs fast infrared controller (Texas Instruments TIR2000PAG) U15. Digital RF transceiver 10 is capable of being computer-controlled, through nine signals/lines TRANSMIT 60, RECEIVE 62, TX 64, CLK 66, DAT 68, LE 70, LOCKED 72, RX 74, and CARRIER 76 generated by controller U15 under host control through bus J1.

Controller U15 supports standard bus interfaces to host computer 102 and the Infrared Data Association (IrDA) 1.1 pulse position modulation (4PPM) data encoding format. In the embodiment shown, bus J1 is a PCMCIA bus, but it could be appropriately configured to support ISA, PCI, RS-244, parallel, USB, or other bus architectures.

Controller U15 follows the IrDA Serial Infrared Physical Layer Link Specifications (version 1.2) to encode every two bits of data to be transmitted as a 4PPM data symbol. The duration of each data symbol is subdivided into a set of equal time slices called "chips." In the 4PPM scheme used by controller U15, the number of chips is set to four. Because there are four unique chip positions within each symbol in 4PPM, four independent symbols exist in which only one chip is asserted while the others are not. Table 1 defines the 4PPM data symbol representation of the four unique combinations of unencoded data bit pairs.

TABLE 1

4 PPM Symbol Encoding Definition

| Unencoded Data Bit Pair | 4 PPM Data Symbol |
| --- | --- |
| 00 | 1000 |
| 01 | 0100 |
| 10 | 0010 |
| 11 | 0001 |

These four unique symbols are defined to be the only valid data symbols allowed in 4PPM. This allows easy error correction; if a data symbol is received which contains more than one asserted chip, the data is known to be corrupted. The position of the asserted chip within the data symbol indicates which possible combination of unencoded data bits is represented. As there are four valid data symbols, each data symbol represents two bits of unencoded data, so that a byte of unencoded data is represented by four data symbols in sequence.

Controller U15 also follows the IrDA Serial Infrared Physical Layer Link Specifications (version 1.2) to define a complete 4PPM packet format for data transmission. Data to be transmitted is encoded according to the 4PPM scheme described. The 4PPM-encoded data in the packet is preceded by symbols defining a preamble field (PA) and a start flag (STA), and followed by symbols defining a frame check sequence field (FCS) and a stop flag (STO). PA can be used by the receiving decoder to establish bit synchronization. Once it has done so, it searches for STA to begin data symbol decoding. The receiving decoder continues to decode until it reads STO, which indicates the end of a 4PPM data packet. FCS contains a cyclic redundancy check (CRC) value which is first calculated using the IEEE 802 CRC32 algorithm from the unencoded data, and then encoded in the same 4PPM scheme and then is included in the data packet. PA, STA, and STO comprise symbols which are not one of the four valid data symbols described above, so that they are unambiguously distinguished from valid data symbols.

Controller U15 accepts digital information intended for transmission on the data lines D0–D7 of the computer bus J1. Controller U15 then encodes the digital information into 4PPM data symbols, and assembles 4PPM data packets including PA, STA, the 4PPM data symbols, FCS, and STO. Controller U15 then asserts signal TRANSMIT 60, and sends the 4PPM data packet serially onto line TX 64 for transmission.

Referring to FIG. 6A above, the advantages of injecting digital information directly into loop filter 32 to directly vary RF output 35 of VCO 34 can now be understood. The IrDA data encoding scheme is used in digital RF transceiver 10 to encode data, because the encoded data and the additional packet information share important properties. In particular, PA, STA, and STO, as defined, share one characteristic with valid data symbols: in each, one chip is asserted for every three which are not. Thus a 4PPM packet always has a substantially constant duty cycle of 25 percent. Since the digital information has a substantially constant duty cycle, the digital signal on line TX 64 injected into loop filter 32 through resistor R39 produces a substantially constant voltage offset when integrated and stored on capacitor C69. This substantially constant voltage offset is accommodated by capacitors C71 and C72 of loop filter 32, where the values of capacitors C71 and C72 are chosen such that the frequency acquisition time of PLL 30 is longer than the rate at which digital information is transmitted on line TX 64. Thus the transmission of digital information with a substantially constant duty cycle to VCO 34 through loop filter 32 does not disturb the lockon the carrier frequency of PLL 30. This scheme allows direct generation of the transmission signal by VCO 34 without causing instability in the feedback loop between PLL 30 and VCO 34. This scheme also eliminates the need for separately generating and then mixing both carrier and signal frequencies, allowing a simpler and relatively inexpensive design, without a separate (and relatively expensive) additional mixer and sideband filter.

When controller U15 is instructed to receive data, it asserts signal RECEIVE 62. upon receipt of a 4PPM data packet on line RX 74, it will remove STA, check for illegal 4PPM symbols, and check for CRC and packet-length errors. Then it will signal the computer though bus J1 that data has been received and decoded, and is ready to be read though bus J1 on data lines D0–D7.

FIG. 12 shows a CIS ROM system 190 which includes nonvolatile PCMCIA attribute memory (ATMEL AT28C16-TC) U17, which can store the identity information for transceiver 10, especially for Plug-and-Play identification during installation.

Digital RF transceiver 10 and its control by the circuitry of FIG. 11 constitutes the physical layer (PHY) of a wireless network interface. Other than the 4PPM encoding and packet formation, Media Access Control (MAC) functions are not present in the circuitry shown. Most MAC functions are located in transceiver device driver 106 of host computer 102 to simplify the design and reduce manufacturing costs. As communication through computer bus J1 is often much more slower than that between a PHY and a hardware MAC, transceiver device driver 106 is configured to overcome a number of timing problems.

Where multiple devices share the same transmission medium, only one device is usually allowed to transmit at a time to prevent data corruption. Most MACs, such as those in standard Ethernet networks, use Carrier Sense, Multiple Access/Collision Detection (CSMA/CD) to share a single transmission medium among multiple devices. In CSMA/CD, any device that wishes to transmit data must first check that no other device is currently transmitting. While transmitting, the device must listen to detect the carriers of other devices. If it does so, it decides there was a collision, and attempts to resend the data. One problem results when other devices also try to resend their data, such that an infinite loop of collisions can occur. One solution to this problem is for each device to wait a random delay time after detecting a collision before attempting to retransmit its data. This procedure, called "random backoff", makes it unlikely that more than one device will restart transmission at the same time.

In the present invention, implementing MAC functions in transceiver device driver software 106 of host computer 102 produces random backoff as a natural consequence. The clocks of each host computer 102 typically run at slightly different speeds from each other, and each host computer 102 can be interrupted by other components or devices which share bus J1 with controller U15, and also by application interrupts. Thus, if no host is currently transmitting, any host can begin transmitting immediately, and it will be unlikely that more than one host will decide to begin at the same time. The only circumstance in which it will be likely is if there are more than two hosts active, and one ends a transmission. The other hosts may be waiting to transmit. In this case, each host must generate a random time, and wait for that time before transmitting.

In the present invention, each host begins to generate a random waiting time automatically when it has stopped receiving a transmission (or has just finished transmitting data), not just when the host wishes to transmit. Thus, even if a particular host coupled to the RF WLAN shown in FIG. 2 has no present need to send data, it has already begun its random backoff waiting period. If that period has expired when the host decides to send data, that host can immediately do so, without further delay. Thereby random backoff can be achieved without the loss of efficiency caused by having the host start a new random waiting period every time it desires to transmit.

The FCC mandates the use of spread spectrum techniques for the frequency band 2400–2483.5 MHZ. Digital RF transceiver 10 implements frequency-hopping spread spectrum (FHSS) transmission in this band. But as the frequency for transmission of encoded data is selected by control signals CLK 66, DAT 68, and LE 70 of PLL 30 (of digital RF transceiver 10), the frequency-hopping nature of digital RF transceiver 10 is entirely external to it. That is, transceiver 10 does not control which channels are used, the order in which they are used, and the chipping rate (how often the transmission frequency of transceiver 10 is changed, or "hopped"). In the embodiment shown in FIG. 11, it is transceiver device driver 106 of host 102 which determines the frequency-hopping algorithm.

One such frequency-hopping algorithm selects one of a number of pre-determined channel sequences for the WLAN. The hosts create the WLAN by synchronizing to a common phase on that sequence and thereafter hopping in unison through the given sequence. Each host attempts to establish synchronization with other hosts by traversing the channel sequence in reverse order, and waiting for a short period at each channel frequency to listen for transmissions from other hosts. If transmissions are detected, the selected hopping sequence and phase can be directly determined, and the host joins the WLAN. If a host does not detect transmissions from other hosts within a minimum period, it transmits a request for acknowledgement on its current channel. If another host acknowledges in response, the hopping sequence and phase can be determined directly. If there is no answer within a certain period, the host continues traversing the frequencies in reverse order. If a host traverses the channel sequence a number of times without detecting transmissions from any other hosts, the host concludes that it is currently the only active host, and selects an arbitrary channel within the sequence and establishes the WLAN itself. At this point the host begins traversing the channel sequence in a forward order.

The hosts on the WLAN keep in tight synchronization by occasionally broadcasting special data packets informing other hosts of their current local phase. All other hosts receiving a phase broadcast by one host can then adjust their phase if it is not synchronized with that of the broadcasting host. A host will also keep synchronized with other hosts by broadcasting a hop command on the current channel to informing the other hosts whenever it decides to hop to the next channel. A host that receives such a command will hop to the next channel, so that all hosts in the WLAN stay on the same channel. During normal operation, should a host ever fail to detect transmissions from other hosts for longer than a number of hop periods, it considers itself out of synchronization, and will once again begin the above-described procedure to establish synchronization.

A feature of the transceiver device driver 106 is that the time to hop from channel to channel has been reduced by preloading PLL 30 with the next channel frequency after enabling it to use the currently loaded channel frequency. PLL 30 is programmed by a pattern of bits presented on lines CLK 66, DAT 68, and LE 70. The bit patterns represent the PLL frequency coefficients selecting particular channel frequencies. The preloading is accomplished by loading a bit pattern first having the latch enable bit (which instructs PLL 30 that already loaded and valid frequency are to be used) and concludes with the frequency coefficients for the next channel. Thus the frequency coefficients for the next channel have already been loaded into PLL 30 by the prior bit pattern that enabled the prior channel. When transceiver device driver 106 needs to change the channel frequency, the bit pattern it sends changes the channel frequency of PLL 30 immediately with the first bit of the bit pattern (the latch enable bit sent on line LE 70), rather than having to wait until the entire bit pattern is sent before changing the frequency. This enhances the ability of hosts to stay in synchronization.

Another feature of transceiver device driver 106 that reduces the time necessary to control PLL 30 is that the frequency coefficients are precompiled. That is, the bit patterns that need to be presented to PLL 30 in order to program it with the coefficients of the desired frequency are precalculated (one bit pattern for each frequency) and stored as strings within transceiver device driver 106 itself. Transceiver device driver 106 can then take advantage of string I/O instructions available in the instruction sets of many microprocessors, allowing transceiver device driver 106 to program PLL 30 with a single instruction, rather than needing one instruction for each byte or word of the bit pattern. This ensures that the output of the bit patterns to PLL 30 through controller 108 is done in the shortest possible time.

Multiple logically independent WLAN networks can be created by different sets of hosts using different predetermined channel sequences. Such a scheme makes more bandwidth available for data transmission while still meeting FCC requirements. Each set of hosts using the same predetermined channel sequence is referred to as a co-located network, or "CoNet". There are two different methods for specifying the channel sequences for CoNets. The first is that all CoNets use the same channel sequence, but at any given time, all the hosts inma CoNet are on a different channel than those hosts in other CoNets. One advantage of this methodology is that two or more CoNets are, in principle, never broadcasting on the same channel at the same time. One problem with this methodology is that drift between the clocks that control the frequency hopping of the CoNets can cause the phase between CoNets to change, and when two CoNets come into phase, they will both be broadcasting on the same channel in a state of continual collision. Another methodology implemented in transceiver device driver 106 assigns a channel sequence to each CoNet such that any two CoNets, regardless of the phase relationship between them, will broadcast on the same channel only once in each channel sequence. For this to be true for the maximum number of possible channel sequences, the number of channels in each sequence should be a prime number. This allows the maximum number of CoNets with minimal collisions.

Collisions are handled by digital packet filtering employed by transceiver device driver 106. Each packet of data transmitted is prepended with header information which includes both a number representing the current channel and a number representing the identity of the CoNet that the host belongs to. These numbers, which are transmitted as part of the 4PMM encoded data, allow a receiving host to determine whether a particular packet is intended for it. Hosts then can discard packets from other CoNets.

FIG. 13 shows a functional block diagram of transceiver device driver 106. Transceiver device driver 106 couples to the Network Device Interface Standard (NDIS) Library and Miniport Wrapper 202 provided by the Microsoft Windows® operating system (OS). NDIS 202 provides the standard interface between applications coupled to the OS and transceiver device driver 106 (coupled to digital transceiver 10 via interface 108). When NDIS 202 sends a data packet to transceiver device driver 106 at its standard miniport, Miniport Send block 206 places the packet into Transmit Queue 208, where each data packet waits to be sent in turn via transceiver 10. When transceiver 10 signals transceiver device driver 106 (via a hardware interrupt sent by interface 108) that its internal FIFO buffer is getting low (having sent most of its data), Transmit ISR (Interrupt Service Routine) block 210 transfers the next block of data, from the currently pending packet in Transmit Queue 208, to interface 108. When the currently pending packet has been entirely transmitted, Transmit ISR 210 signals Transmit DPC (Deferred Procedure Call) block 212 that the empty packet should be retrieved and sent back to NDIS.

When data is received by transceiver 10, it is first sent to Receive ISR block 214, which places it into the currently pending received data packet in Receive Queue 216. Once the currently pending received data packet is completed, Receiver ISR 214 signals Receive DPC 218 that the completed packet should be retrieved and forwarded to NDIS 202.

Collision Avoidance Manager block 220 coordinates the random back-off procedures described above. Whenever transceiver 10 has finished transmitting or receiving a packet, Collision Avoidance Manager block 220 starts a random timer so that transceiver 10 can start to transmit a new data packet only when the random timer has expired, by controlling Transmit ISR block 210.

Beacon Manager block 222 is responsible for sending a number of "beacons" or special signaling packets to all transceivers 10 coupled to an RF network. Beacon Manager 222 sends an "Idle" beacon periodically, to introduce some activity to the network, and help keep all transceivers in synch. Beacon Manager 222 sends a "Request" beacon during its hunting mode, when transceiver 10 attempts to find the current frequency of the network by stepping through the frequency hops backwards. When transceiver sends a "Request" beacon at the current frequency, the other RF-coupled hosts return an "Idle" beacon to acknowledge the correct current frequency. Beacon Manager 222 also sends a "Hop" beacon to alert all RF-coupled hosts to hop to the next frequency. Transceiver device driver 106 independently sends a DPC to NDIS 202 to "wake up" transceiver device driver 106 at the appropriate time for the next hop, which ensures that a hop will happen. The additional "Hop" beacon, however, can cause the hop in the RF WLAN to occur with a more predictable latency period, but can sometimes be interrupted if there is some temporary break in RF communications.

Hop Manager 224 coordinates the timing of hops, and queues up a hop beacon with Beacon Manager 222, and sends a hop DPC to NDIS 202. If Hop Manager 224 receives a "Hop" beacon (from another host), it checks to see if it is in fact a proper time to hop. If it is, then Hop Manager 224 calculates the next frequency channel (based upon a look-up table of frequency values), sends appropriate signals to interface 108 to have transceiver 10 hop, and then clears any queued "Hop" beacon of its own.

Synch Manager 226 coordinates the synchronization of transceiver 10 with all other transceivers 10 coupled to the RF WLAN. If transceiver 10 is fully in synch, Synch Manager 226 instructs appropriate Hop beacons to be sent. Synch Manager 226 determines if transceiver 10 suddenly falls out of synch for any reason, and then places the system in hunting mode, and uses Beacon Manager 222 to send "Request" beacons at channels traversed in backwards order (as described above).

Clock Manager block 228 places time stamps in beacon packets and retrieves time stamps placed in received beacon packets, and resets its clock based upon such time stamps, so that the entire RF WLAN can remain relatively synchronized in time.

FIG. 14 is a schematic diagram of an embodiment using a single antenna 250. The antenna 250 arranged to receive the transmitted RF signal may be the same antenna as the transmitting antenna. The transceiver 10 may include the power amplifier 24 (without the antenna 40). The input of the power amplifier 24 may be coupled to the first output of the switch 22. A second switch 252 may be configured to couple the antenna 250 either to the input of the low-noise amplifier 44 for reception or to the output of the power amplifier 24 for transmission.

Other embodiments are within the scope of the claims. For example, the MAC layer handled by transceiver device driver 106 can be incorporated in firmware or hardware along with transceiver 10. The transceivers can be coupled to any device requiring wireless digital communication, including personal digital assistants, household appliances, televisions, telephones, and other electronic devices. Various other methods and devices for generating, encoding, receiving, and decoding digital messages can be employed. Various other radio-frequencies can be used, and other RF transmission schemes other than spread-spectrum frequency hopping can be employed.

What is claimed is:

1. A method for radio frequency (RF) transmission of digital information comprising the steps of:

(A) generating an RF signal using a voltage-controlled oscillator (VCO);

(B) providing an error signal from a phase-locked loop (PLL) responsive to the RF signal to an input of the VCO;

(C) filtering the error signal with a loop filter;

(D) combining the digital information with the error signal in the loop filter; and (E) receiving the digital information combined with the error signal at the VCO, thereby causing variations in frequency of the RF signal from the VCO that represent the digital information.

2. The method of claim 1, further comprising the step of broadcasting the RF signal.

3. The method of claim 1, wherein the rate of change of the digital information is faster than a response time of the PLL.

4. The method of claim 3, wherein the digital information is encoded to have a duty cycle which is substantially constant.

5. The method of claim 4, wherein the digital information is encoded according to a pulse position modulation (PPM) scheme defined by an Infrared Data Association (IrDA) 4PPM data encoding standard.

6. The method of claim 1, further comprising the step of changing a channel frequency of the RF signal according to a series of channel frequencies, wherein the series of channel frequencies is determined by the steps of:
  generating a series of at least a first and a second channel-select signals, each channel-select signal comprising an enable bit and at least one frequency coefficient;
  sending each channel-select signal in turn to the PLL; and
  changing a tuning frequency of the PLL according to the frequency coefficient of the first channel-select signal upon receiving the enable bit of the second channel-select signal.

7. The method of claim 6, wherein a number of distinct channel frequencies in the series of channel frequencies is a prime number.

8. The method of claim 7, further comprising the step of repeating the series of channel frequencies such that each channel frequency within the series of channel frequencies is used no more than once in each repetition of the series of channel frequencies.

9. The method of claim 1, further comprising the steps of:
  receiving a second RF signal;
  demodulating the second RF signal to produce a demodulated second RF signal;
  determining a signal level threshold from the demodulated second RF signal; and
  comparing the demodulated second RF signal to the signal level threshold to regenerate a second digital information from the demodulated second RF signal.

10. The method of claim 9, further comprising the step of using the RF signal from the VCO as a local oscillator signal to demodulate the second RF signal.

11. A method for radio frequency (RF) transmission of digital information comprising the steps of:
  (A) generating an RF signal using a voltage-controlled oscillator (VCO);
  (B) providing an error signal from a phase-locked loop (PLL) to the VCO;
  (C) encoding the digital information to have a duty cycle which is substantially constant;
  (D) forming a data packet containing the digital information in response to encoding; and
  (E) combining the data packet with the error signal of the PLL before providing to the VCO, thereby causing whereby variations in frequency in the RF signal from the VCO that represent the data packet.

12. The method of claim 11, wherein the data packet has a duty cycle which is substantially constant.

13. The method of claim 11, wherein both the digital information is encoded and the data packet is formed according to a pulse position modulation (PPM) scheme defined by an Infrared Data Association (IrDA) 4PPM data encoding standard.

14. A method for receiving digital information sent by a radio frequency (RF) transmitter using an Infrared Data Association (IrDA) 4 pulse position modulation (PPM) data encoding standard comprising the steps of:
  (A) receiving an RF signal;
  (B) demodulating the RF signal to present a demodulated RF signal;
  (C) determining a signal level threshold from the demodulated RF signal;
  (D) comparing the demodulated RF signal to the determined signal level threshold to thereby regenerate IrDA-formatted data from the demodulated RF signal; and
  (E) decoding the IrDA-formatted data to reproduce the digital information.

15. A method of implementing communication between a plurality of host computers comprising the steps of:
  (A) exchanging digital information between a first host computer and a first radio frequency (RF) transceiver;
  (B) encoding the digital information using pulse position modulation (PPM) according to an Infrared Data Association (IrDA) 4PPM data encoding standard;
  (C) forming a data packet from the encoded digital information according to the IrDA 4PPM data encoding standard;
  (D) generating an RF signal using a first voltage-controlled oscillator (VCO);
  (E) providing an error signal from a first phase-locked loop (PLL) to the VCO;
  (F) combining the data packet with the error signal of the first PLL before providing to the VCO, thereby causing variations in frequency in the RF signal from the first VCO that represent the data packet;
  (G) transmitting the RF signal to a second RF transceiver;
  (H) receiving the RF signal at the second RF transceiver;
  (I) demodulating the RF signal at the second RF transceiver to produce a demodulated RF signal;
  (J) determining a signal level threshold from the demodulated RF signal;
  (K) comparing the demodulated RF signal to the determined signal level threshold to thereby regenerate the data packet from the demodulated RF signal;
  (L) reproducing the digital information by decoding the data packet; and
  (M) exchanging the digital information with a second host computer.

16. The method of claim 15, wherein media access control (MAC) functions are located in host computer software at both the first and the second host computers.

17. The method of claim 15, further comprising the step of changing a channel frequency of the RF signal according to a series of channel frequencies determined by the steps of:
  generating a series of at least a first and a second channel-select signals, each channel-select signal comprising an enable bit and at least one frequency coefficient;
  sending each channel-select signal in turn to the first PLL; and
  changing the tuning frequency of the first PLL according to the frequency coefficient of the first channel-select signal upon receiving the enable bit of the second channel-select signal.

18. The method of claim 17, wherein a number of distinct channel frequencies in the series of channel frequencies is a prime number.

19. The method of claim 18, further comprising the step of repeating the series of channel frequencies such that each channel frequency within the series of channel frequencies is used no more than once in each repetition of the series of channel frequencies.

20. The method of claim 15, further comprising the step of waiting a pseudorandom time from an end of a last transmission or reception before transmitting.

21. The method of claim 20, wherein the pseudorandom time is determined by a pseudorandom number generator.

22. The method of claim 20, wherein the pseudorandom time is determined by clock drift of one of the host computers relative to another of the host computers.

23. The method of claim 20, wherein the pseudorandom time is determined by interrupts generated by other operations of the host computers.

24. An apparatus for radio frequency (RF) transmission of digital information comprising:
- a voltage-controlled oscillator (VCO) arranged to generate an RF signal;
- a phase-locked loop (PLL) arranged to (i) receive the RF signal and (ii) present an error signal;
- an encoder arranged to convert the digital information into a form having a data rate faster than a response time of the PLL; and
- a coupler arranged to couple both the error signal and the digital information as encoded to the VCO.

25. The apparatus of claim 24, further comprising an antenna coupled to the VCO to receive the RF signal.

26. The apparatus of claim 24, wherein the coupler is a loop filter.

27. The apparatus of claim 24, wherein the encoder is further arranged to convert the digital information into a form having a duty cycle which is substantially constant.

28. The apparatus of claim 27, wherein the encoder is further arranged to convert the digital information according to a pulse position modulation (PPM) scheme defined by an Infrared Data Association (IrDA) 4PPM data encoding standard.

29. The apparatus of claim 24, further comprising a selector arranged to change a channel frequency of the RF signal according to a series of channel frequencies determined by (i) generating a series of at least a first and a second channel-select signals, each channel-select signal comprising an enable bit and at least one frequency coefficient and (ii) sending each channel-select signal in turn to the PLL, wherein the PLL changes a tuning frequency according to the frequency coefficient of the first channel-select signal upon receiving the enable bit of the second channel-select signal.

30. The apparatus of claim 29, wherein a number of distinct channel frequencies used by the selector in the series of channel frequencies is a prime number.

31. The apparatus of claim 30, wherein the selector repeats the series of channel frequencies such that each channel frequency within the series of channel frequencies is used no more than once in each repetition of the series of channel frequencies.

32. An apparatus for radio frequency (RF) reception of digital information comprising:
- an antenna configured to receive an RF signal containing the digital information;
- a low-noise amplifier configured to amplify the RF signal received by the antenna;
- a local RF oscillator configured to produce a signal having a frequency in proximity to a channel frequency of the RF signal;
- a mixer configured to present an intermediate signal in response to the signal provided by the local RF oscillator and the RF signal presented by the low-noise amplifier;
- an FM demodulator configured to demodulate the intermediate signal to produce a baseband signal; and
- a decoder configured to extract the digital information from the baseband signal according to a pulse position modulation (PPM) scheme defined by an Infrared Data Association (IrDA) 4PPM data encoding standard.

33. An apparatus for radio frequency (RF) transmission and reception of digital information comprising:
- a voltage-controlled oscillator (VCO) arranged to generate an RF signal;
- a phase-locked loop (PLL) arranged to receive the RF signal from the VCO;
- an encoder arranged to convert the digital information into a form having a data rate faster than a response time of the PLL;
- a coupler coupling both an error signal presented by the PLL and the digital information as encoded to the VCO;
- a switch configured to couple the RF signal to at least one of a plurality of outputs;
- a first antenna coupled to a first output of the switch and arranged to transmit the RF signal;
- an antenna arranged to receive a second RF signal;
- a low-noise amplifier coupled to the antenna, the low-noise amplifier amplifying and filtering the second RF signal;
- a mixer configured to present an intermediate signal in response to the second RF signal provided by the low-noise amplifier and the RF signal presented by the switch;
- an FM demodulator configured to demodulate the intermediate signal to produce a baseband signal; and
- a decoder reproducing the digital information from the baseband signal.

34. The apparatus of claim 33, wherein the antenna arranged to receive the second RF signal is the same antenna as the first antenna, and further comprising:
- a power amplifier coupled to the first output of the first switch; and
- a second switch configured to couple the first antenna either to the low-noise amplifier for reception of the second RF signal, or to the power amplifier for transmission of the RF signal.

35. The apparatus of claim 33, wherein the coupler is a loop filter.

36. The apparatus of claim 33, wherein the encoder is arranged to convert the digital information into a form having a duty cycle which is substantially constant.

37. The apparatus of claim 36, wherein the encoder converts the digital information according to a pulse position modulation (PPM) scheme defined by an Infrared Data Association (IrDA) 4PPM data encoding standard.

38. The apparatus of claim 33, a further comprising a selector arranged to change a channel frequency of the RF signal according to a series of channel frequencies determined by (i) generating a series of at least a first and a second channel-select signals, each channel-select signal comprising an enable bit and at least one frequency coefficient and (ii) sending each channel-select signal in turn to the PLL, wherein the PLL changes a tuning frequency according to the frequency coefficient of the first channel-select signal upon receiving the enable bit of the second channel-select signal.

39. The apparatus of claim 38, wherein a number of distinct channel frequencies used by the selector in the series of channel frequencies is a prime number.

40. The apparatus of claim 39, wherein the selector repeats the series of channel frequencies such that each channel frequency within the series of channel frequencies is used no more than once in each repetition of the series of channel frequencies.

41. The apparatus of claim 33, wherein the decoder reproduces the digital information from the baseband signal according to a pulse position modulation (PPM) scheme defined by an Infrared Data Association (IrDA) 4PPM data encoding standard.

* * * * *